(12) United States Patent
Ellis et al.

(10) Patent No.: US 10,114,739 B2
(45) Date of Patent: *Oct. 30, 2018

(54) REAL TIME ANALYSIS AND CONTROL FOR A MULTIPROCESSOR SYSTEM

(71) Applicant: COHERENT LOGIX, INCORPORATED, Austin, TX (US)

(72) Inventors: Geoffrey N. Ellis, Santa Cruz, CA (US); John Mark Beardslee, Menlo Park, CA (US); Michael B. Doerr, Dripping Springs, TX (US); Ivan Aguayo, Austin, TX (US); Brian A. Dalio, Keller, TX (US)

(73) Assignee: Coherent Logix, Incorporated, Austin, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/276,370

(22) Filed: Sep. 26, 2016

(65) Prior Publication Data
US 2017/0010958 A1   Jan. 12, 2017

Related U.S. Application Data

(63) Continuation of application No. 14/074,925, filed on Nov. 8, 2013, now Pat. No. 9,477,585.
(Continued)

(51) Int. Cl.
| | |
|---|---|
| G06F 9/44 | (2018.01) |
| G06F 11/36 | (2006.01) |
| G06F 11/22 | (2006.01) |
| G06F 17/50 | (2006.01) |
| G06F 13/28 | (2006.01) |
| G06F 9/455 | (2018.01) |

(52) U.S. Cl.
CPC ...... *G06F 11/3688* (2013.01); *G06F 11/2242* (2013.01); *G06F 11/3664* (2013.01); *G06F 13/28* (2013.01); *G06F 17/50* (2013.01); *G06F 9/45504* (2013.01); *G06F 17/5054* (2013.01)

(58) Field of Classification Search
CPC ... G06F 11/2242; G06F 17/50; G06F 9/45504
See application file for complete search history.

(56) References Cited

U.S. PATENT DOCUMENTS

| | | |
|---|---|---|
| 6,681,351 B1 | 1/2004 | Kittross |
| 7,814,466 B2 | 10/2010 | Chen |

(Continued)

*Primary Examiner* — Lewis A Bullock, Jr.
*Assistant Examiner* — Tina Huynh
(74) *Attorney, Agent, or Firm* — Meyertons Hood Kivlin Kowert & Goetzel, P.C.; Jeffrey C. Hood

(57) ABSTRACT

System and method for testing a DUT that includes a multiprocessor array (MPA) executing application software at operational speed. The application software may be configured for deployment on first hardware resources of the MPA and may be analyzed. Testing code for configuring hardware resources on the MPA to duplicate data generated in the application software for testing purposes may be created. The application software may be deployed on the first hardware resources. Input data may be provided to stimulate the DUT. The testing code may be executed to provide at least a subset of first data to a pin at an edge of the MPA for analyzing the DUT using a hardware resource of the MPA not used in executing the application software. The first data may be generated in response to a send statement executed by the application software based on the input data.

20 Claims, 21 Drawing Sheets

Related U.S. Application Data

(60) Provisional application No. 61/724,493, filed on Nov. 9, 2012.

(56) References Cited

U.S. PATENT DOCUMENTS

| 8,407,167 | B1 | 3/2013 | Abts |
|---|---|---|---|
| 2004/0078674 | A1 | 4/2004 | Raimi |

REAL TIME ANALYSIS AND CONTROL FOR A MULTIPROCESSOR SYSTEM

PRIORITY DATA

This application is a continuation of U.S. patent application Ser. No. 14/074,925, titled "Real Time Analysis and Control for a Multiprocessor System," filed on Nov. 8, 2013, which claims priority to U.S. Provisional Application Ser. No. 61/724,493, titled "Real Time Analysis and Control for a Multiprocessor System", whose inventors were Geoffrey N. Ellis, John Mark Beardslee, Michael B. Doerr, Ivan Aguayo, Timothy J. Cook, Christopher H. Genly, and Brian A. Dalio, and which was filed on Nov. 9, 2012.

FIELD OF THE INVENTION

The field of the invention generally relates to software development, automated test, and analysis for digital electronic systems such as computers, digital signal processors (DSPs), and embedded instances of such, and more specifically, to a real time analysis and control for a multiprocessor system.

DESCRIPTION OF THE RELATED ART

The development of new digital electronic products requires a large amount of test, measurement, and characterization to validate the hardware and software in it. For complex digital electronic products the validation costs can be the largest portion of the total development project cost. There are several ways or techniques to reduce test and validation costs.

One way is design for test (DFT), where the product design includes provisions for techniques that simplify testing. This includes provision of test points that increase controllability and observability of the internal states of a product and its component devices. A potential problem with test points is that their location becomes hardened into the system, and may be impossible to change in the final product. Another problem may be that the raw data rate from a test point exceeds the capacity of the system to consume or process the data, and so the product may have to be run at slower than normal speeds to perform a test.

Another way to reduce test and validation costs is automated test, because if a human operator is not required to do a test, then many more tests can be performed per unit time, resulting in a higher probability of catching faults. However, during the development of application software and automated test it is beneficial to support a programmer's incremental design and test in short cycles (interactively).

Another approach is to build test instrumentation into a product in a way that has negligible degradation to the product's normal operation. Built-in Test Instrumentation (BITI) may range from advanced probes that inject and collect complex signals at high speed, to probe signal processing, to analysis capabilities such as statistics and graphical displays. A problem with this approach has been the lack of enough processing resources to consume the raw data at full speed.

Another way is built-in self-test (BIST). BIST may utilize a large number of automatic internal tests, each producing a binary pattern result which is added to a running sum. At the end of all the tests, the running sum is a signature, which may be output and compared to known good signatures generated during design and simulation. BIST may also produce more detailed reports, e.g., reports of which, if any, tests failed.

Both BIST and BITI may be used during the lifetime of a product to enhance its maintainability. Combinations of these techniques may be used on the same device.

Each of the above techniques requires considerable attention to detail and computers are used to track those details. Also, each product differs in its details, and so consequently there may be considerable effort required to program the computers to obtain the test, measurement, and characterization data necessary for each product validation.

The benefits of using these techniques usually outweigh the cost to implement them; however, improvements are possible and ongoing in the industry.

Costs can be reduced in various ways, for example by having the test setup and programming processes make use of reusable, parameterized modules that can be easily combined to make a custom test system for each product.

Benefits can be enhanced in various ways, for example by causing the test operations to run at higher speed so that many more tests can be performed per unit time, thus increasing the coverage of the state space of the application to validate proper operation (or discover bugs before a product reaches customers).

Increasingly, digital electronic systems, such as computers, digital signal processors (DSP), and these systems embedded in enclosing equipment, such as radio telephones, government service radios, consumer wireless equipment such as cellphones, smartphones and tablet computers, cellular base station equipment, video processing and broadcast equipment, object recognition equipment, hyper-spectral image data processing, etc., utilize one or more multiprocessor arrays (MPAs). An MPA may be loosely defined as a plurality of processing elements (PEs), supporting memory (SM), and a high bandwidth interconnection network (IN). As used herein, the term "processing element" refers to a processor or CPU (central processing unit), microprocessor, or a processor core. The word array in MPA is used in its broadest sense to mean a plurality of computational units (each containing processing and memory resources) interconnected by a network with connections available in one, two, three, or more dimensions, including circular dimensions (loops or rings). Note that a higher dimensioned MPA can be mapped onto fabrication media with fewer dimensions. For example, an MPA in an IN with the shape of a four dimensional (4D) hypercube can be mapped onto a 3D stack of silicon integrated circuit (IC) chips, or onto a single 2D chip, or even a 1D line of computational units. Also low dimensional MPAs can be mapped to higher dimensional media. For example, a 1D line of computation units can be laid out in a serpentine shape onto the 2D plane of an IC chip, or coiled into a 3D stack of chips. An MPA may contain multiple types of computational units and interspersed arrangements of processors and memory. Also included in the broad sense of an MPA is a hierarchy or nested arrangement of MPAs, especially an MPA composed of interconnected IC chips where the IC chips contain one or more MPAs which may also have deeper hierarchal structure.

MPAs present new problems and opportunities for software development methods and tools. Since MPAs may extend to thousands of PEs, there is a need to manage large amounts of software to operate the array, and to test, debug, and rebuild such software in efficient ways. Generally this requires modularity, hierarchy, adaptable module re-use, and automated build methods. While these ideas have appeared in conventional software development systems, they have not been integrated into development tools in a way that supports generalized modules that may be adapted statically and/or dynamically to a different number of PEs and other resources depending on performance requirements or a different shape or topology requirement that in turn may depend on resource availability or application requirements.

A software development project is the combination of human and machine work to generate the software that causes some product or service to operate according to the requirements taken on by the development team. Generally more design and test automation is beneficial because it allows for more testing of the generated software and thus eliminates more bugs.

A conventional prior art software development environment for embedded systems is pictured in FIG. 1. Apart from the human software engineers and programmers, there are three main parts to the development environment—these are the final product and the test bench, which may include a workstation, as shown, although in some prior art development systems, the workstation may be considered to be separate from the test bench.

The minimum representation of the final product is a list of technical requirements. The minimum requirement for a test bench is a means to generate test pattern inputs for the device under test (DUT) and a way to capture the outputs of the DUT and compare to known good patterns. The closer the DUT matches the final product the higher is the confidence that the developed software will operate as expected in the final product.

The minimum requirement for a workstation is a desktop or laptop computer with an operating system (OS) that manages the details of mass storage, a database of design data, and a set (or suite) of design tools that read and write the project database. There may be more than one project and more than one project database and tools and libraries can be shared between them to lower development costs.

In general, the memory for computers and DSPs is organized in a hierarchy with fast memory at the top and slower but higher capacity memory at each step down the hierarchy. In an MPA, supporting memories at the top of the hierarchy are located nearby each PE. Each supporting memory may be specialized to hold only instructions or only data. Supporting memory for a particular PE may be private to that PE or shared with other PEs.

Further down the memory hierarchy there may be a larger shared memory typically composed of semiconductor SDRAM with a bit capacity many times larger than that of the supporting memory adjacent to each PE. Further down the memory hierarchy are flash memory, magnetic disks, and optical disks.

As noted above, a multiprocessor array (MPA) includes an array of processing elements (PEs), supporting memories (SMs), and a primary interconnection network (PIN or simply IN) that supports high bandwidth data communication among the PEs and/or memories. Exemplary MPAs are illustrated in FIGS. 2 and 3, described below. Generally, a PE has registers to buffer input data and output data, an instruction processing unit (IPU), and means to perform arithmetic and logic functions on the data, plus a number of switches and ports to communicate with other parts of a system. The IPU fetches instructions from memory, decodes them, and sets appropriate control signals to move data in and out of the PE and to perform arithmetic and logic functions on the data. PEs suitable for large MPAs must generally be more energy efficient than general purpose processors (GPP), simply because of the large number of PEs per IC chip that contains a large MPA.

As used herein, the term MPA covers both relatively homogeneous arrays of processors, as well as heterogeneous collections of general purpose and specialized processors that are integrated on so-called "platform IC" chips. Platform IC chips may contain from a few to many processors, typically interconnected with shared memory and perhaps an on-chip network. There may or may not be a difference between a MPA and a "platform IC" chip. However, a "platform IC" chip may be marketed to address specific technical requirements in a specific vertical market.

An example MPA architecture is the HyperX™ architecture disclosed in U.S. Pat. No. 7,415,594. In one embodiment of the HyperX™ architecture, a multiprocessor array with a wide range of sizes may be composed of a unit-cell-based hardware fabric (mesh), wherein each cell is referred to as a HyperSlice. The hardware fabric may be formed by arranging the unit-cells on a grid and interconnecting adjacent cells. Each HyperSlice may include one or more data memory and routers (DMRs) and one or more processing elements (PEs). In U.S. Pat. No. 7,415,594 a DMR is referred to as a dynamically configurable communication (DCC) element, and a PE is referred to as a dynamically configurable processing (DCP) element. The DMR may provide supporting memory for its neighboring PEs, and routers and links for the interconnection network (IN).

The hardware fabric may be created by abutting HyperSlices together, which involves aligning the HyperSlices to form correct electrical connections. These connections include links to DMRs and connections to a power supply grid. The techniques of replicating the HyperSlices, aligning them, and connecting by abutment are well understood techniques of very large scale integration (VLSI) of integrated circuits (IC) chips, especially ICs fabricated with complementary metal oxide semiconductor (CMOS) circuit technology. This hardware fabric has a PIN that operates independently and transparently to the processing elements, and may provide on-demand bandwidth through an ensemble of real-time programmable and adaptable communication pathways (which may be referred to as routes or channels) between HyperSlices supporting arbitrary communication network topologies. Coordinated groups of HyperSlices may be formed and reformed "on-the-fly" under software control. This ability to dynamically alter the amount of hardware used to evaluate a function allows for the optimal application of hardware resources to relieve processing bottlenecks. At the edge of the hardware fabric, links may connect to circuits specialized for types of memory that are further down the memory hierarchy, or for I/O at the edge of an integrated circuit (IC) chip.

The interconnected DMRs may provide nearest-neighbor, regional, and global communication across the chip and from chip to chip. Each of these communication modes may physically use the DMR resources to send data/messages differently depending on locality of data and software algorithm requirements. A "Quick Port" facility may be provided to support low latency transfer of one or more words of data from a processor to any network destination. For block transfers, Direct Memory Access (DMA) engines within the DMR may be available to manage the movement of data across the memory and routing fabric. For nearest-neighbor communication between PEs, the use of shared memory and registers may be the most efficient method of data movement. For regional and global data movement, using the routing fabric (the PIN) may be the most efficient method. Communication pathways (or routes) can either be dynamic or static. Dynamic routes may be set up for data transfer and torn down upon the completion of the transfer to free up PIN resources for other routes and data transfers. Static routes may remain in place throughout the program execution and are primarily used for high priority and critical communications. The physical location of communication pathways and the timing of data transfers across them may be under software program control. Multiple communication pathways may exist to support simultaneous data transfer between any senders and receivers.

The architecture of the DMR may allow different interchangeable PEs to be used in a multiprocessor fabric to optimize the system for specific applications. A HyperX™ multiprocessor system may comprise either a heterogeneous or homogeneous array of PEs. A PE may be a conventional processor, or alternatively a PE may not conform to the conventional definition of a processor. A PE may simply be a collection of logic gates serving as a hard-wired processor for certain logic functions where programmability is traded off for higher performance, smaller area, and/or lower power.

FIG. 2 illustrates a view of the network of processing elements (PE's) and Data Memory Routers (DMRs) of an exemplary HyperX™ system, per the prior art. The PE's are shown as rectangular blocks and the DMRs are shown as circles. The routing channels between DMRs are shown as dotted lines. Solid triangles show off-mesh communication and solid lines show active data communication between DMRs. A computational task is shown by its numerical identifier and is placed on the PE that is executing it. A data variable being used for communication is shown by its name and is placed on the DMR that contains it. In this exemplary example, the top left PE has been assigned a task with task ID 62, and may communicate with other PEs or memory via the respective DMRs adjacent to the PE, designated by communication path variables t, w, and u. As also shown, in this embodiment, an active communication channel connects a PE designated 71 (e.g., another task ID) to an off-mesh communication path or port via an adjacent DMR labeled "x".

FIG. 3 illustrates an exemplary multiprocessor system implemented on a chip, per the prior art. As shown, the chip includes multiple I/O routers for communication with off-chip devices, as well as an interior multiprocessor fabric, similar to the exemplary system of FIG. 2. A HyperX™ processor architecture may include inherent multi-dimensionality, but may be implemented physically in a planar realization as shown. The processor architecture may have high energy-efficient characteristics and may also be fundamentally scalable (to large arrays) and reliable—representing both low-power and dependable notions. Aspects that enable the processor architecture to achieve unprecedented performance include the streamlined processors, memory-network, and flexible IO. The processing elements (PEs) may be full-fledged DSP/GPPs and based on a memory to memory (cacheless) architecture sustained by a variable width instruction word instruction set architecture that may dynamically expand the execution pipeline to maintain throughput while simultaneously maximizing use of hardware resources.

An example of DMR hardware structure according to the prior art is shown in more detail in FIG. 4, where a central data memory (DM) is surrounded by an octagonal ring representing a router. Note that the octagonal shapes shown are merely symbolic, and that actual shapes may be different, e.g., may be rectangular. As may be seen, around the DMR are a number of bi-directional arrows representing data paths to other DMRs and PEs. These bidirectional data paths may be implemented with actual bidirectional transceivers at each end, or as a pair of unidirectional paths directed oppositely.

Unidirectional arrows between the router and the data memory in FIG. 4 represent unidirectional data paths between memory and router. A small square near theses arrows represents a DMA engine, i.e., a DMA reader (DMAR) to support readout from DM, and/or a DMA writer (DMAW) to support writing data to DM. A DMAR engine generates address signals for the memory, typically to increment across a buffer, reading data to send out a link to another DMR. Similarly, a DMAW engine generates address signals for the memory, typically to increment across a buffer, writing data that it receives from a link. Each DMA engine is much smaller than a PE and uses less power, so they are attractive to use for read and write of blocks of memory. DMA engines may be configured by PE writes to associated configuration registers in the DM memory space. Writing to a particular address triggers a DMA to start incrementing. When a DMA finishes incrementing through a block of addresses, it stops—unless configured to continue looping indefinitely.

Software is the ensemble of instructions (also called program code) that is required to operate a computer or other stored-program device. Software can be categorized according to its use. Software that operates a computer for an end user for a specific use (such as word processing, web surfing, video or cell phone signal processing, etc.) may be termed application software. Application software includes the source program and scripts written by human programmers, a variety of intermediate compiled forms, and the final form called run time software may be executed by the target device (PE, microprocessor, or CPU). Run time software may also be executed by an emulator which is a device designed to provide more visibility into the internal states of the target device than the actual target device for the purposes of debugging (error elimination).

Development software (a group or suite of software development tools) is software used to generate application software. Basic development tools include a compiler, an assembler, and a linker, as indicated in FIG. 5, which illustrates an exemplary software design and development flow for an MPA based system, according to the prior art. An editor whereby a user writes source code in a high level programming language, e.g., C or C++, may also be considered to be a basic development tool. A human engineer or programmer typically designs a program and translates it to source code in a high level programming language, represented by the documents of FIG. 5 labeled "a complete design", which may be created via a program editor. In the block labeled "language compilation/assembly", a compiler is used to translate source code into modular address-relocatable object code; an assembler is then used to create modular machine code; and finally, a linker is used to create an executable binary image of the entire program. As shown, optimization may also be performed in and between any of these stages. This process of compiling, assembling, and linking (making a binary image), including optimization, labeled "process the design to create chip programming files", can be automated with instructions to the operating system stored in "make files". To test the program, the binary image is generally loaded into the memory of the target device, represented in FIG. 5 by the provision and implementation of "chip programming information" to a "processor IC chip", i.e., "program the chip", and executed (i.e., "run the program"). Other common software tools include a debugger (to load, start, pause, dump, and disassemble the binary image from the target PE), and cycle-accurate simulators. Cycle accurate simulators provide complete visibility into the processor internal states but they run much slower than the target hardware, e.g., by many orders of magnitude.

For multiprocessors systems there is an important extra step compared to a single processor system, which is the allocation of particular processing tasks or modules to particular physical resources—these being PEs, supporting memory, and communication resources between and among PEs and system I/O ports. Communication resources may include routers, links between routers, paths comprising strings of alternating routers and links, supporting memory, and DMA engines interposed between the supporting memory and the routers (or links). Note that resource allocation may include allocation of data variables onto memory resources, because allocation of shared and localized memory may have an impact on allocation of the PE and communication resources, and vice versa. In FIG. 5 this extra step is represented by the block labeled Resource Allocation (which may also be referred to as physical design). The resource allocation part of the flow may utilize a placement and routing tool, which may be used to assign tasks to particular PE in the array, and to select specific ports and communication pathways (paths) in the IN. Note that the physical design of the entire system need not be done all at once; in particular software-defined test instrumentation may be added later, after the development of application software and at any time, including while the system is executing. However, if done this way, the ability to add test instrumentation will depend on available resources on a chip that are unused by the application software and the access to signals of interest. Access may be blocked by dense layout of the application software, or intentionally blocked by the use of the security features of the chip.

Portions of a design may be allowed to change dynamically in controlled ways during normal execution of the run time software. Conventional microprocessors support memory allocation and de-allocation during program execution. For the IN resources, the machine code instructions to set up and tear down a communication pathway may be encoded in relatively few words of data, and thus the instructions for many pathways may be easily stored in supporting memory for a PE. Therefore a run-time program task on a PE may set up and tear down pathways to dynamically communicate as needed, with the side benefit that during intervals that it does not use communication resources, those resources are available to other PEs. The I/O ports may be dynamically allocated depending on the communication pathways that dynamically connect to it. The allocation of tasks to PEs also may be changed during run time by overlay mechanisms which allow the PEs instruction memory to be overwritten with a new task.

When MPA resources allocations are changing during run time, there is potential for performance improvement, but also a need to coordinate the changes to prevent performance degradation or deadlock situations. Therefore the optimization of the system can include the time dimension as well as the resource dimensions in space. Additionally, optimization of the system can be influenced by system constraints, e.g. run-time latency, delay, power dissipation, data processing dependencies, etc. Thus, the optimization of such systems may be a multi-dimensional optimization.

FIG. 6 illustrates a more detailed exemplary software design data flow, according to the prior art. As may be seen, a third party system development tool is generally used to create a program in a standard high level programming language, e.g., C, C++, etc., which is compiled, assembled, and linked, to generate an image (binary executable). As also shown, the results of the compilation may be further utilized to optimize the software in light of the target hardware. More specifically, task extraction, multi-dimensional optimization (mentioned above), and resource assignment/allocation may be performed based on system constraints and the target hardware product, e.g., a HyperX™ hardware product, as indicated. As shown, this process may be iterative in nature. A suite of software development tools has been developed for HyperX™ architecture devices and is included in the HyperX™ Integrated Software Development Environment (ISDE) product.

When few processors are involved, the physical design (the assignment of application software tasks to physical locations and the specific routing of communication pathways) is relatively simple and can be done manually. Even so, the work load of each processor may vary dramatically over time, so that some form of dynamic allocation may be desirable to maximize throughput. However, for MPAs with large numbers of PEs, the physical design process can be tedious and error prone if done manually. To address these issues software development tools for multiprocessor systems have been created to define tasks (blocks of program code) and communication requirements (source and destination for each pathway) and to automatically allocate resources to tasks (place and route). If a design is large or contains many repeated tasks it may be more manageable if expressed as a hierarchy of cells. A hierarchical description may have to be flattened into a list of all the tasks and all the communication pathways that are required at run time before the place and route tools can be used to complete the physical design. Alternative design flows that support incremental hardening of the hierarchy may also support incremental place and route.

The idea of hierarchical, configurable cells has been previously used in the area of Hardware Description Languages (HDLs). Hierarchical configurability is built into commonly used HDLs such as Verilog and VHDL. However, those methods are oriented toward creating designs that are implemented in logical gates and are not usually utilized for a multiprocessor array. The major differences are the models of computation used in each domain. In the HDL model, all the computation resources generally default to concurrent execution, but can be specified for sequential execution. In contrast, the multiprocessor model assumes a restricted number of streams of parallel computation, each of which follows a sequential execution model.

These HDLs have no representations of the unique properties of multiprocessor arrays, e.g., unique or shared memory spaces, unique or shared synchronization resources, or sets of processor specific machine instructions. In contrast, software languages for multiprocessors include representations of these features.

In the field of software languages, function configurability has been utilized for some time. However, prior art software programming languages do not support programming reusability (of both fixed and reconfigurable cells) and managing design complexity with hierarchical decomposition. For example, the construct known as "templates" in C++ allows a function to be specialized for a particular use; however, the range of parameterization is limited to the data types of its arguments and does not allow changes in the parallel implementation of the computation.

FIG. 7 illustrates a generic conventional test bench and test equipment for testing a digital device, according to the prior art. As shown, a device under test (DUT) is situated at the center on a development board that supplies power and high speed, dense signal connections from a pattern generator (PG) on the left to the DUT and from the DUT to a logic analyzer (LA) on the right. The PG contains digital memory which can be loaded from the computer and sent to the DUT either in isolated bursts or as a pattern that is repeated indefinitely. The LA contains memory for storing data words received from the DUT. The LA can be programmed to not store data until it has been presented with a specific pattern in the data (a trigger signal), thus storing the data of interest after a particular event rather than collecting large amounts of data of which much of it is of no interest. A PC is used to control the PG and LA and to collect results onto mass storage.

With the arrival of vastly more complex IC devices due to denser IC fabrication technologies, there has been a trend to put more memory IC chips and faster computer connections onto the development board, including mass memory and microprocessors, as shown in FIG. 8. These non-DUT IC chips may be used to move large amounts of data between the development board and the PC over standard USB and Ethernet connections.

Note that the DUT of FIG. 8 is shown with some on-chip resources allocated to accepting test input data ("resources for test inputs") and some resources to probe collection and processing of output data ("resources for test outputs"). Most of the DUT resources are allocated to the application functionality ("resources for application"). A separate computer is used for overall test control, test programming, test data analysis, test results display, and mass storage. Since computers and microprocessors are getting faster, in many cases the traditional pattern generator and logic analyzer can be removed in many situations.

The idea of using part of a programmer-configurable IC chip as a probe or as an instrument to test or characterize another part of the same chip has been described in the literature. For example, one category of configurable IC chip is the Field Programmable Gate Array (FPGA). FPGAs are typically configured through the use of development software that takes programmer input in an HDL to define functionality and then compiles this down to a configuration "bit stream" that is input to a particular FPGA chip to configure it. To test the configuration, digital test signals may be injected and collected by programmer-defined probes built into the configuration bit stream.

In Ferguson, S.; "Vector signal analysis of digital baseband and IF signals within an FPGA," IEEE Autotestcon 2005 Digest of Papers, pp. 402-407, Orlando, Fla., 26-29 Sep. 2005, an on-chip multiplexer was used to collect data from several different places in an application configuration of an FPGA chip for the purpose of streaming data into a logic analyzer:

"This paper presents the combination of a dynamic FPGA probe, which enables routing of signal groups within an FPGA to a logic analyzer for measurement through a small number of physical package pads, with an FFT-based vector signal analysis software package. This combination provides simultaneous measurement of time domain, frequency spectrum, and modulation quality on digital signals inside an FPGA. It also provides the quick selection of various internal nets for signal analysis without time-consuming redesigns of the FPGA."

In Lowdermilk, R. W.; Harris, F. J.; "Vector Signal Analyzer Implemented as a Synthetic Instrument," Instrumentation and Measurement, IEEE Transactions on, vol. 58, no. 2, pp. 281-290, February 2009, a "synthetic instrument" or SI was designed for a FPGA:

" . . . to perform the multiple tasks of targeted digital signal processing (DSP)-based instruments. The topic of this paper is vector signal analysis from which time-dependent amplitude and phase is extracted from the input time signal . . . .

. . . the vector signal analyzer can present many of the quality measures of a modulation process. These include estimates of undesired attributes such as modulator distortion, phase noise, clock jitter, I-Q imbalance, inter-symbol interference, and others. This is where the SI is asked to become a smart software-defined radio (SDR), performing all the tasks of a DSP radio receiver and reporting small variations between the observed modulated signal parameters and those of an ideal modulated signal. Various quality measures (e.g., the size of errors) have value in quantifying and probing performance boundaries of communication systems."

These are FPGA implementations which are designed most often in a hardware description language HDL which is logic-gate oriented and generally does not contain constructs for specification of MPA features such as program tasks, processors, and IN pathway setup and message passing.

For a multiprocessor (MPA) computer system composed of many processing elements (PEs), supporting memory (SM), and a high-bandwidth primary interconnection network (PIN), there is a need to communicate high-bandwidth signals into and out of the MP system for purposes of test, debug, and performance characterization.

Some or all of the MPA system may be located on one or more VLSI IC chips, which increases the difficulty of probing either to inject external signals or to collect internal signals for test/debug purposes. This reduces the controllability and visibility of internal states. Computer simulation can show all internal states and signals. However, for systems operating under conditions of very low error rate, millions of test packets of dummy information and noise need to be passed through the system to obtain statistically valid characterization; and thus computer simulation takes too long. What is needed is test and characterization of an operational system where hardware and software operate at speeds close to the final system target speed (real time).

Minimal test bench capabilities needed are to generate signals and noise to be injected into critical points in the application hardware/software, collect signals and noise from critical points in hardware and software, compare signals to known good signals, process signals (either simply or in a complex way, depending on type of characterization), and support soft probes to stream out internal signals of interest, and inject stream signals.

Accordingly, improved techniques and tools for real time analysis and control for multiprocessor systems are desired.

SUMMARY OF THE INVENTION

Various embodiments of a system and method for testing a device under test (DUT) are presented, where the DUT includes a multiprocessor array (MPA) that includes a plurality of processing elements, a plurality of memories, and a high bandwidth interconnection network (IN) communicatively coupling the plurality of processing elements and the plurality of memories. The MPA executing the application software in real time at full operational speed is or is included in the device under test (DUT)

In one embodiment, application software that is desired to be tested may be modified to include testing code, thereby producing modified application software. The testing code in the modified application software may include at least one auxiliary send statement. The application software may be configured to execute on and/or use first hardware resources of a multiprocessor array (MPA), where the testing code may be configured to execute on at least one of the first hardware resources and is configured to use one or more second hardware resources of the MPA, where the one or more second hardware resources are different from the first hardware resources and are not used by the application software and where the MPA executing the application software comprises a device under test (DUT).

The modified application software executing on the MPA may receive input data to stimulate the DUT, generate first data in the DUT based on the input data, execute a first send statement to provide the first data for use by the modified application software. and execute the at least one auxiliary send statement to provide at least a subset of the first data to a pin at an edge of the MPA using at least one of the second hardware resources.

The at least a subset of the first data provided by the at least one auxiliary send statement may be received, where the at least a subset of the first data are useable for analyzing the DUT.

In some embodiments, in providing at least a subset of the first data to a pin at an edge of the MPA, the at least one auxiliary send statement may program a first direct memory access (DMA) engine of the MPA to provide the at least a subset of the first data to a pin at an edge of the MPA, and where the first DMA engine is one of the second hardware resources (not used to execute the application software). The application software may be configured to store the first data in a first memory of the MPA, where the first memory is one of the first hardware resources used by the application software, where a plurality of DMA engines are associated with the first memory, including the first DMA engine that is one of the second hardware resources. In one embodiment, a second DMA engine may be associated with the first memory, where the second DMA engine is one of the first hardware resources used by the application software to store the first data in the first memory. In some embodiments, in providing the at least a subset of the first data to a pin at an edge of the MPA, the at least one auxiliary send statement may filter the first data, thereby generating the at least a subset of the first data.

In some embodiments, the first send statement may be configured to execute on a first processor element of the first hardware resources, and the at least one auxiliary send statement may be configured to execute on the first processor element of the first hardware resources. The DUT may comprise the modified application software executing on the MPA in real time at full operational speed. In some embodiments, the DUT may receive real time data from an external signal source coupled to the DUT to stimulate the DUT.

In one embodiment, modifying the application software may include analyzing the application software to locate the first send statement in the application software, and automatically inserting the at least one auxiliary send statement in the application software proximate to the first send statement. Moreover, in further embodiments, modifying the application software may include analyzing the application software to locate a plurality of send statements in the application software, and automatically inserting a corresponding one or more auxiliary send statements in the application software proximate to respective ones of the plurality of send statements. Alternatively, or additionally, one or more auxiliary send statements may be manually inserted (by a user) in the application software proximate to respective ones of a plurality of send statements in the application software.

The first data may be provided for use by the modified application software via a first data path through the IN of the MPA, and the at least a subset of the first data may be provided to a pin at an edge of the MPA via a second data path through the IN of the MPA, where the second data path is different from the first data path.

In some embodiments, the above techniques may be implemented or performed by a software defined test bench, where the software defined test bench may be configured to analyze the DUT with negligible impact on DUT performance.

In another embodiment, the application software that is desired to be tested may be modified to include testing code, thereby producing modified application software, where the testing code in the modified application software includes at least one auxiliary send statement, where the testing code may be configured to use one or more second different resources of the MPA, where the one or more second different resources are not used by the application software, and where the MPA executing the application software comprises a device under test (DUT).

The modified application software executing on the MPA may receive input data to stimulate the DUT, generate first data in the DUT based on the input data, execute a first send statement to provide the first data for use by the modified application software, and execute an auxiliary send statement to provide the first data to a pin at an edge of the MPA using at least one of the one or more second resources of the MPA.

The first data resulting from the auxiliary send statement may be received, where the first data are useable for analyzing the DUT.

In a further embodiment, a method for testing a device under test (DUT) that comprises a multiprocessor array (MPA) executing application software may include analyzing application software that is desired to be tested, where the application software is configured to be deployed on first hardware resources of a multiprocessor array (MPA), wherein the MPA includes a plurality of processing elements, a plurality of memories, and a high bandwidth interconnection network (IN) communicatively coupling the plurality of processing elements and the plurality of memories. The method may further include creating test program code which is executable to configure hardware resources on the MPA to duplicate data generated in the application software for analysis purposes, and deploying the application software on the first hardware resources of the MPA, where the MPA executing the application software comprises a device under test (DUT). Input data may be provided to stimulate the DUT, where the DUT comprises the MPA executing the application software in real time at full operational speed. The test program code may be executed to provide at least a subset of first data to a pin at an edge of the MPA using at least one of the hardware resources that are not used in executing the application software, where the first data are generated in response to a send statement executed by the application software in response to the input data. The at least a subset of the first data resulting from the executing the test program code may be received, where the at least a subset of the first data are useable for analyzing the DUT.

BRIEF DESCRIPTION OF THE DRAWINGS

A better understanding of the present invention can be obtained when the following detailed description of the preferred embodiment is considered in conjunction with the following drawings, in which.

Figure 1:
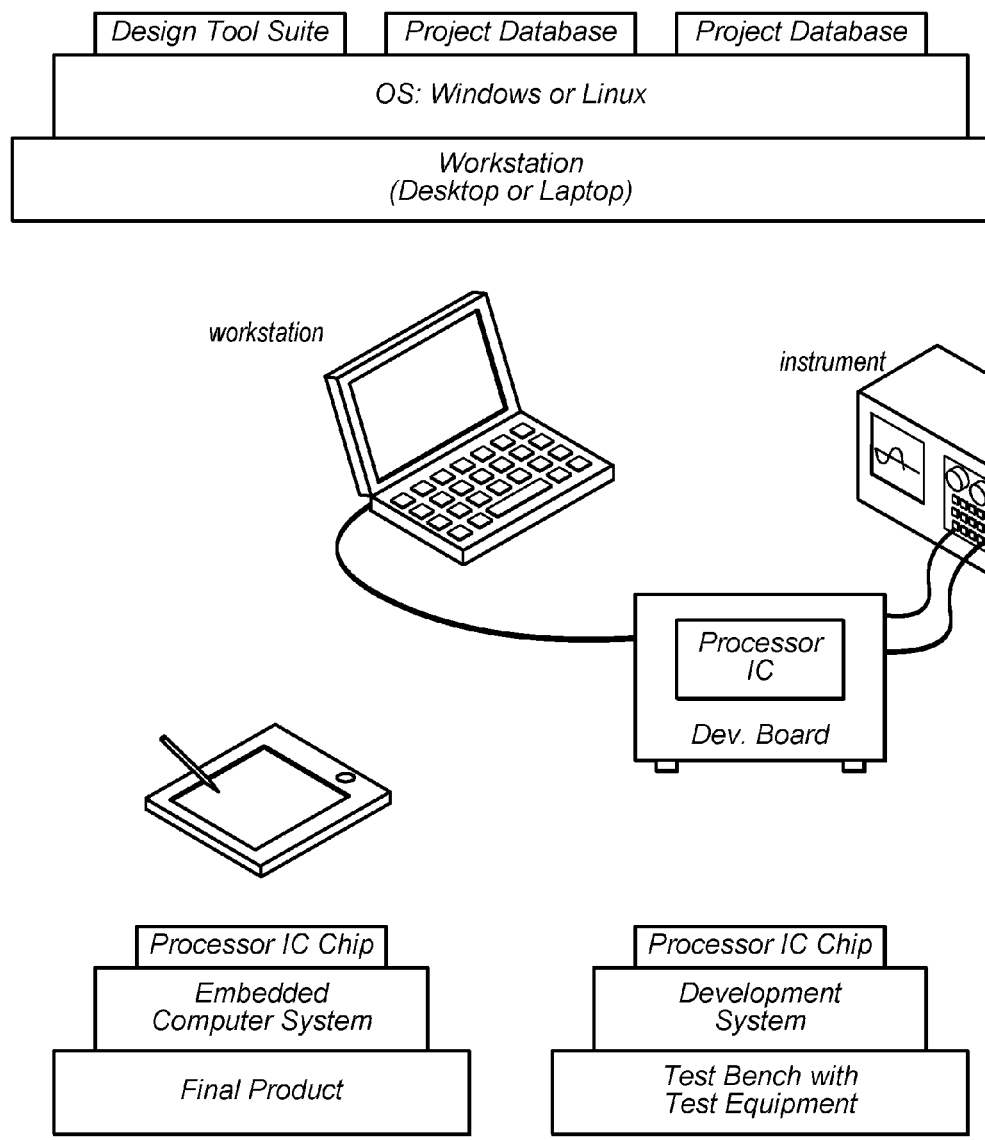
FIG. 1 illustrates an exemplary development system, according to the prior art.
Figure 2:
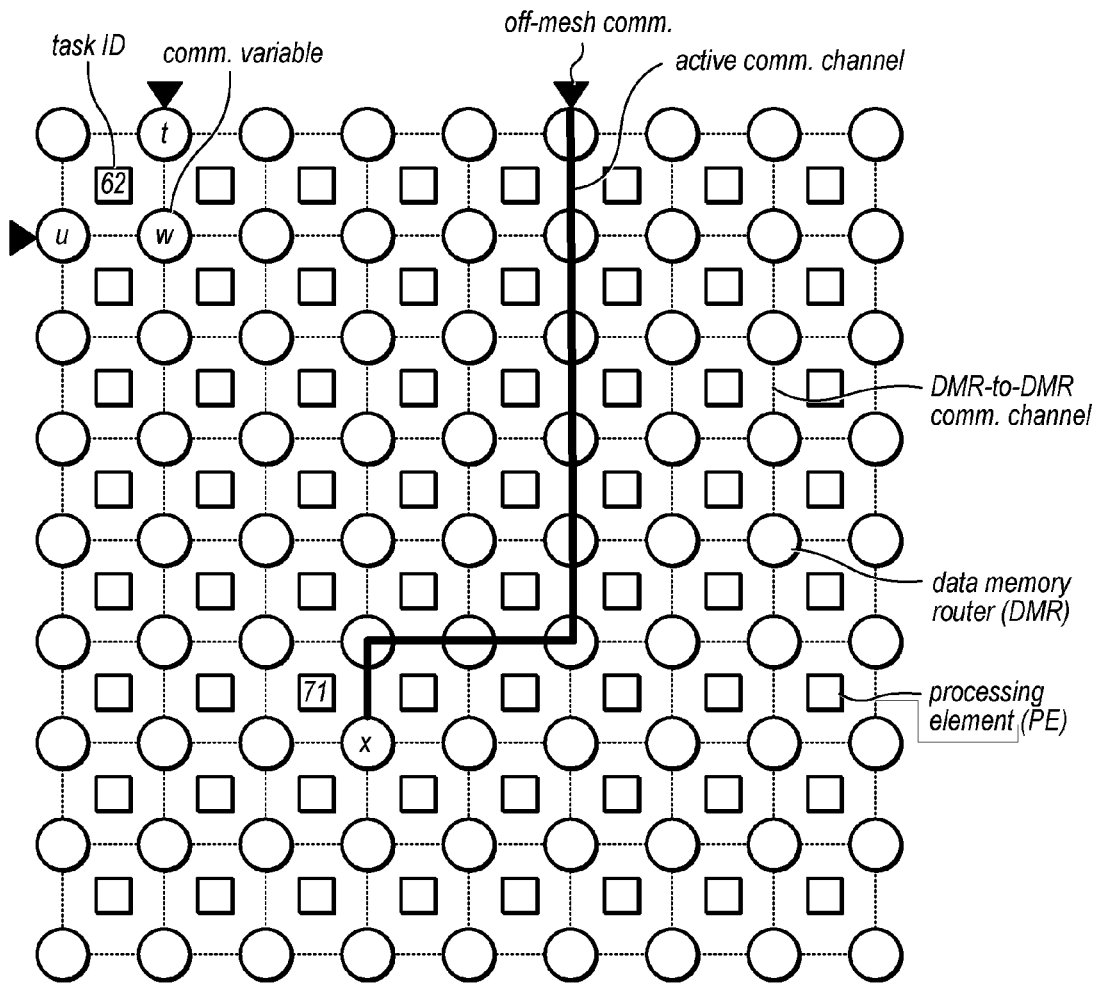
FIGS. 2, 3, and 4 illustrate exemplary multiprocessor array (MPA) systems, according to the prior art.
Figure 3:
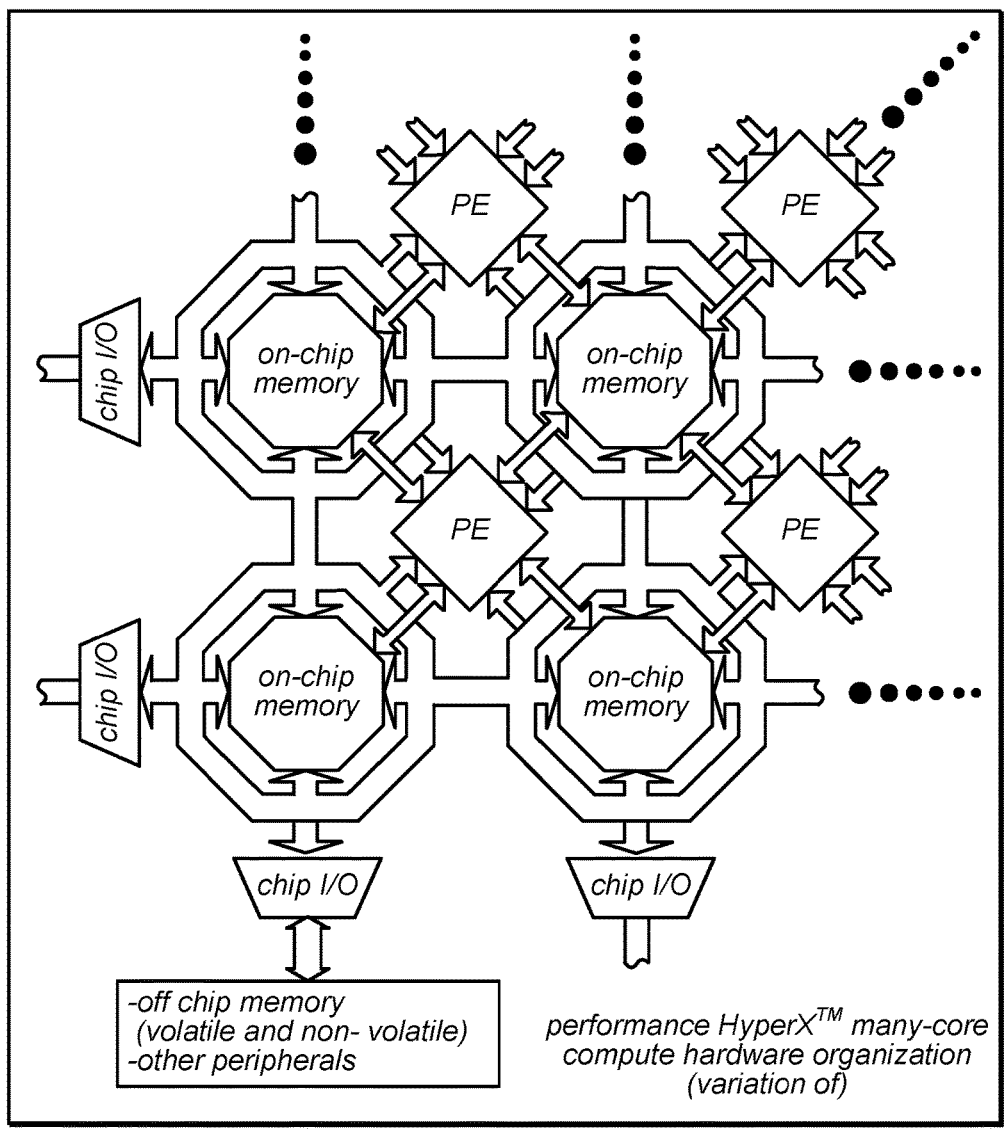
Figure 4:
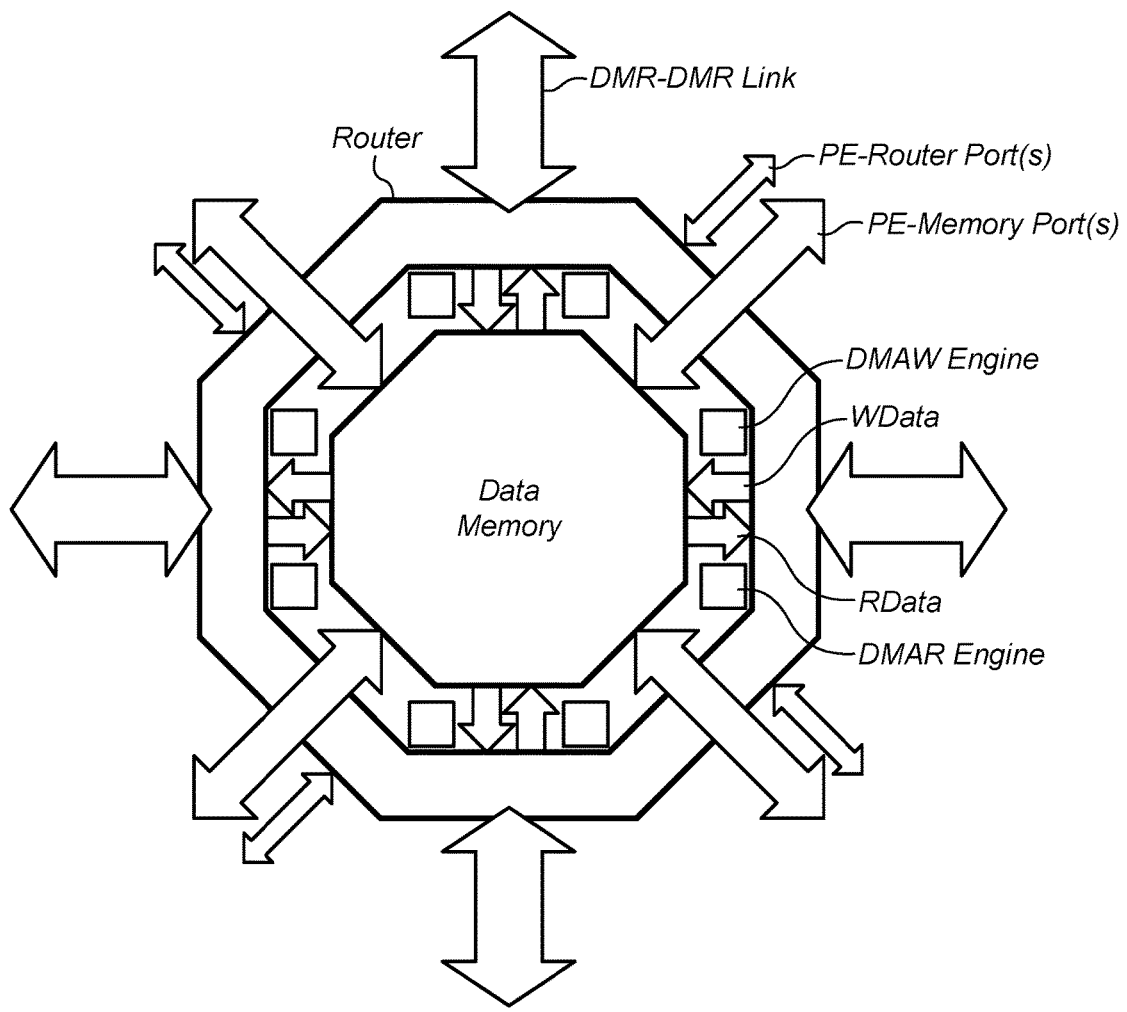

While the invention is susceptible to various modifications and alternative forms, specific embodiments thereof are shown by way of example in the drawings and are herein described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF EMBODIMENTS OF THE INVENTION

Incorporation by Reference

The following patent is hereby incorporated by reference in its entirety as though fully and completely set forth herein:

U.S. Provisional Application Ser. No. 61/724,493, titled "Real Time Analysis and Control for a Multiprocessor System", filed on Nov. 9, 2012

U.S. Pat. No. 7,415,594 titled "Processing System with Interspersed Stall Propagating Processors and Communication Elements filed on Jun. 24, 2003, whose inventors are Michael B. Doerr, William H. Hallidy, David A. Gibson, and Craig M. Chase.

U.S. patent application Ser. No. 13/274,138, titled "Disabling Communication in a Multiprocessor System", filed Oct. 14, 2011, whose inventors are Michael B. Doerr, Carl S. Dobbs, Michael B. Solka, Michael R Trocino, and David A. Gibson.

TERMS

The following is a glossary of terms used in the present application:

Memory Medium—Any of various types of memory devices or storage devices. The term "memory medium" is intended to include an installation medium, e.g., a CD-ROM, floppy disks 104, or tape device; a computer system memory or random access memory such as DRAM, DDR RAM, SRAM, EDO RAM, Rambus RAM, etc.; or a non-volatile memory such as a magnetic media, e.g., a hard drive, optical storage, or ROM, EPROM, FLASH, etc. The memory medium may comprise other types of memory as well, or combinations thereof. In addition, the memory medium may be located in a first computer in which the programs are executed, and/or may be located in a second different computer which connects to the first computer over a network, such as the Internet. In the latter instance, the second computer may provide program instructions to the first computer for execution. The term "memory medium" may include two or more memory mediums which may reside in different locations, e.g., in different computers that are connected over a network.

Carrier Medium—a memory medium as described above, as well as a physical transmission medium, such as a bus, network, and/or other physical transmission medium that conveys signals such as electrical or optical signals.

Programmable Hardware Element—includes various hardware devices comprising multiple programmable function blocks connected via a programmable or hardwired interconnect. Examples include FPGAs (Field Programmable Gate Arrays), PLDs (Programmable Logic Devices), FPOAs (Field Programmable Object Arrays), and CPLDs (Complex PLDs). The programmable function blocks may range from fine grained (combinatorial logic or look up tables) to coarse grained (arithmetic logic units or processor cores). A programmable hardware element may also be referred to as "reconfigurable logic".

Application Specific Integrated Circuit (ASIC)—this term is intended to have the full breadth of its ordinary meaning. The term ASIC is intended to include an integrated circuit customized for a particular application, rather than a general purpose programmable device, although ASIC may contain programmable processor cores as building blocks. Cell phone cell, MP3 player chip, and many other single-function ICs are examples of ASICs. An ASIC is usually described in a hardware description language such as Verilog or VHDL.

Program—the term "program" is intended to have the full breadth of its ordinary meaning. The term "program" includes 1) a software program which may be stored in a memory and is executable by a processor or 2) a hardware configuration program useable for configuring a programmable hardware element or ASIC.

Software Program—the term "software program" is intended to have the full breadth of its ordinary meaning, and includes any type of program instructions, code, script and/or data, or combinations thereof, that may be stored in a memory medium and executed by a processor. Exemplary software programs include programs written in text-based programming languages, e.g., imperative or procedural languages, such as C, C++, PASCAL, FORTRAN, COBOL, JAVA, assembly language, etc.; graphical programs (programs written in graphical programming languages); assembly language programs; programs that have been compiled to machine language; scripts; and other types of executable software. A software program may comprise two or more software programs that interoperate in some manner.

Hardware Configuration Program—a program, e.g., a netlist or bit file, that can be used to program or configure a programmable hardware element or ASIC.

Computer System—any of various types of computing or processing systems, including a personal computer system (PC), mainframe computer system, workstation, network appliance, Internet appliance, personal digital assistant (PDA), grid computing system, or other device or combinations of devices. In general, the term "computer system" can be broadly defined to encompass any device (or combination of devices) having at least one processor that executes instructions from a memory medium.

Automatically—refers to an action or operation performed by a computer system (e.g., software executed by the computer system) or device (e.g., circuitry, programmable hardware elements, ASICs, etc.), without user input directly specifying or performing the action or operation. Thus the term "automatically" is in contrast to an operation being manually performed or specified by the user, where the user provides input to directly perform the operation. An automatic procedure may be initiated by input provided by the user, but the subsequent actions that are performed "automatically" are not specified by the user, i.e., are not performed "manually", where the user specifies each action to perform. For example, a user filling out an electronic form by selecting each field and providing input specifying information (e.g., by typing information, selecting check boxes, radio selections, etc.) is filling out the form manually, even though the computer system must update the form in response to the user actions. The form may be automatically filled out by the computer system where the computer system (e.g., software executing on the computer system) analyzes the fields of the form and fills in the form without any user input specifying the answers to the fields. As indicated above, the user may invoke the automatic filling of the form, but is not involved in the actual filling of the form (e.g., the user is not manually specifying answers to fields but rather they are being automatically completed). The present specification provides various examples of operations being automatically performed in response to actions the user has taken.

Development Process—refers to the life-cycle for development based on a methodology. At a coarse level it describes how to drive user requirements and constraints through design, implementation, verification, deployment, and maintenance.

Overview

The following describes various embodiments of a system for real time analysis and control (RTAC) where test instrumentation is built inside data processing devices (especially multiprocessing devices) and their related software development systems. While the data processing device is executing a product application at full speed, RTAC may be configurable to access (read or write) any internal state of the device that is not secured, tap into digital signal streams anywhere in the device that is not secured while the device is executing a product application, process digital signal streams in a variety of standard ways (decimate, interpolate, filter, add noise, trigger on pattern or threshold, on up to Fourier transforms, etc.), generate test signals and compare to processed signals, operate autonomously at high speed, and be relatively easy to set up by using software components, which may be referred to as "views".

The RTAC approach disclosed herein includes development software with reusable and custom-configurable modules and can run autonomously, and so may decrease software development costs and improve quality of application software in products that use compatible data processing devices.

It should be noted that the techniques disclosed herein may be particularly beneficial for MPAs of certain array sizes. For example, in one exemplary embodiment, the MPA may include three or more PEs. In other exemplary embodiments, the size (number of PEs, supporting memory, and associated communication resources in the array) of the MPA may be greater than or equal to some specified number, which in various different embodiments may have any value desired, e.g., 4, 8, 16, 24, 32, 64, etc. More generally, depending on the particular application or use, the number of PEs in the MPA may have a specified lower bound, which may be specified to be any plural value, as desired.

Real-Time Control

In some embodiments, the basic notion of Real-Time Control (RTC) is that the linker produces a table of variables and parameters used by the run time software with their absolute locations in SM. This linker table may be used with a secondary interconnection network, e.g., a serial bus, to "peek" and "poke" individual values to specific addresses while the application software is running, and may not otherwise interfere with it. Non-interference is possible when the MPA has, in its hardware, a secondary interconnection network (SIN), such as a serial bus, that is independent of the primary interconnection network (PIN). A SIN typically has much lower bandwidth than the high-bandwidth PIN and so the SIN is not used by application software.

An exemplary SIN was disclosed in U.S. patent application Ser. No. 13/274,138, titled "Disabling Communication in a Multiprocessor System", which was incorporated by reference above.

In one embodiment, an interactive software development environment may provide a variety of tools whereby the linker table is maintained, and an RTC tool (which may be part of an RTAC tool) may be called to make automatic translations of "write(value, address)" into a set of SIN commands and then to communicate these commands from the PC to the Development System board and thence to the DUT, where the execution of these SIN commands writes the specified value to the variable/parameter at the specified address.

Similarly, to read out a value of a variable or a parameter the linker table may be used to find its location and address information; the RTC tool may be called or otherwise used to translate "read(address)" into SIN Commands, which may then be communicated to the DUT. Upon execution, the internal value may be read out, communicated back to the PC, and displayed. Scripts may be used to change large numbers of variables/parameters, but a generalized script may be developed to handle arrays.

Real-Time Analysis

In some embodiments, a real-time analysis (RTA) tool (which may be part of an RTAC tool) may be provided that includes an overall control program running on a workstation, i.e., a host computer, e.g., a PC/laptop computer, or any other type of computer desired, that governs (and in some embodiments, may be considered to be a part of) a software defined test bench (SDTB) which exercises a device under test (DUT) and its application software running on an MPA at clock speeds appropriate to the final application.

Figure 9:
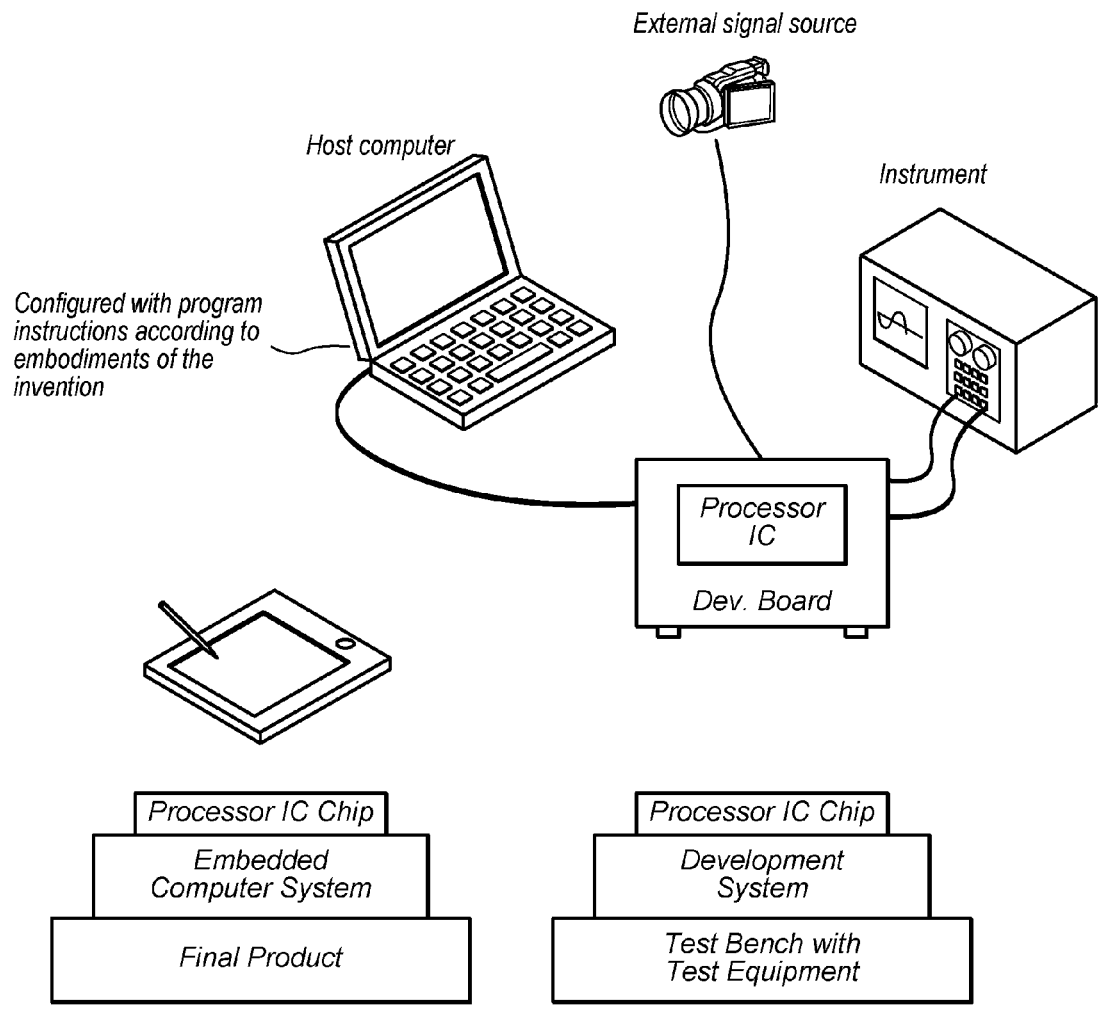
FIG. 9 illustrates a system for testing a DUT that includes an MPA executing application software, according to one embodiment.

FIG. 9—Exemplary System for Testing a DUT

FIG. 9 illustrates a system for testing a DUT that includes an MPA executing application software, according to one embodiment. As shown, in this exemplary embodiment, the system includes a host computer, a development board that includes a development system and a test bench with test equipment, configured to test a DUT, in this particular case, a processor IC (integrated circuit), and an instrument, e.g., a logic analyzer or oscilloscope, as well as an external signal source, e.g., a video camera. In some embodiments, the host computer, the development board, and the instrument may compose a software defined test bench that may implement embodiments of the present techniques.

The software defined test bench (SDTB) may be configured to provide (at least some) input data, e.g., a test vector(s) and/or signal streams, to stimulate the DUT and collect data from it, although in some embodiments, the input data may include real time signals (e.g., data) from an external signal source coupled to the DUT, possibly via the development board, such as that shown in FIG. 9. The SDTB may be designed to be as fast as the DUT and to have negligible impact on DUT performance. The SDTB may provide the DUT with stimulus and response test vectors and collects data about its operation. The SDTB may be configured to subsample the probed signals to reduce the data processing requirements of the PC, and in some embodiments can be expanded to include synthetic instruments and simulated RF analog channel impairments.

Figure 7:
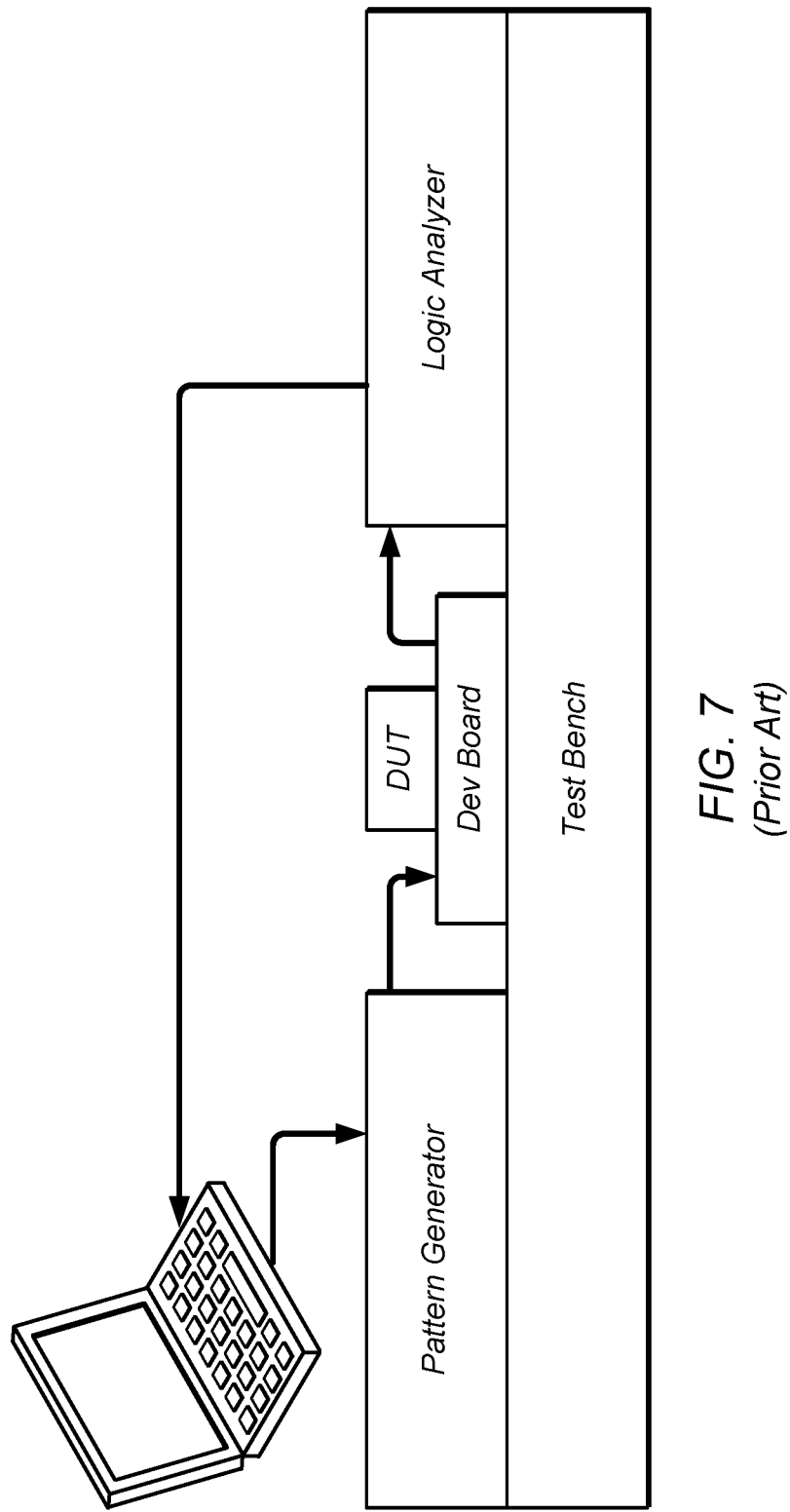
FIGS. 7 and 8 illustrate test benches and test equipment, according to the prior art.
Figure 8:
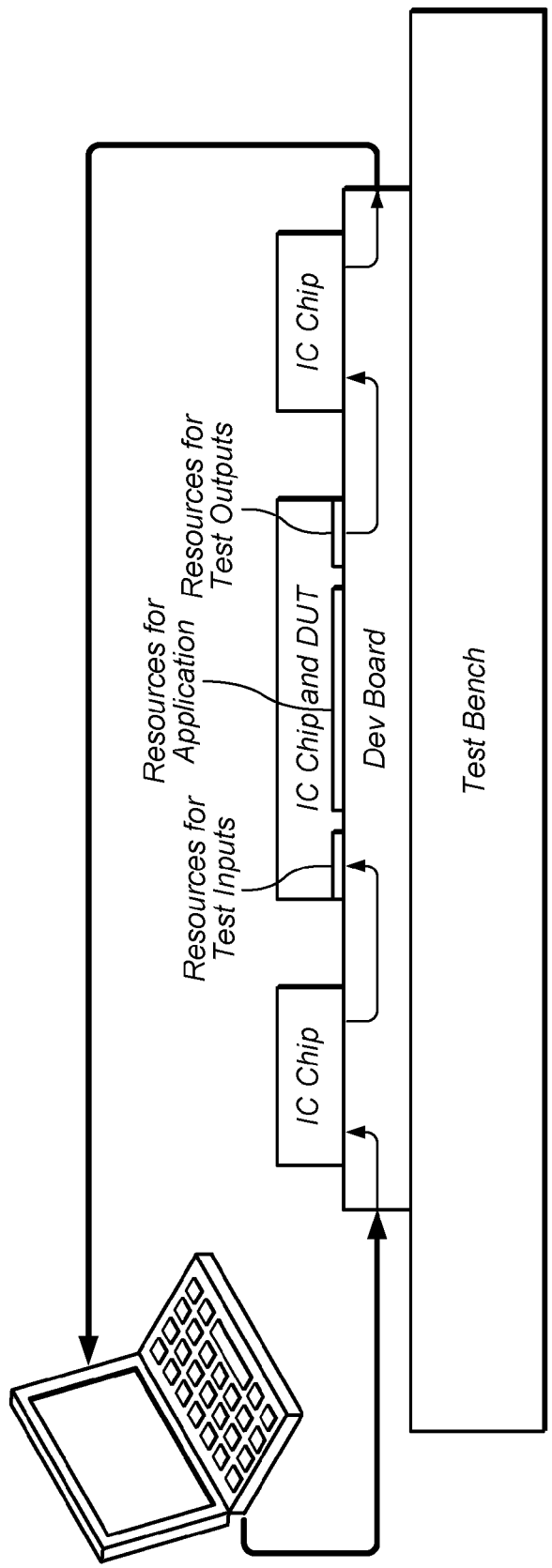
Figure 10:
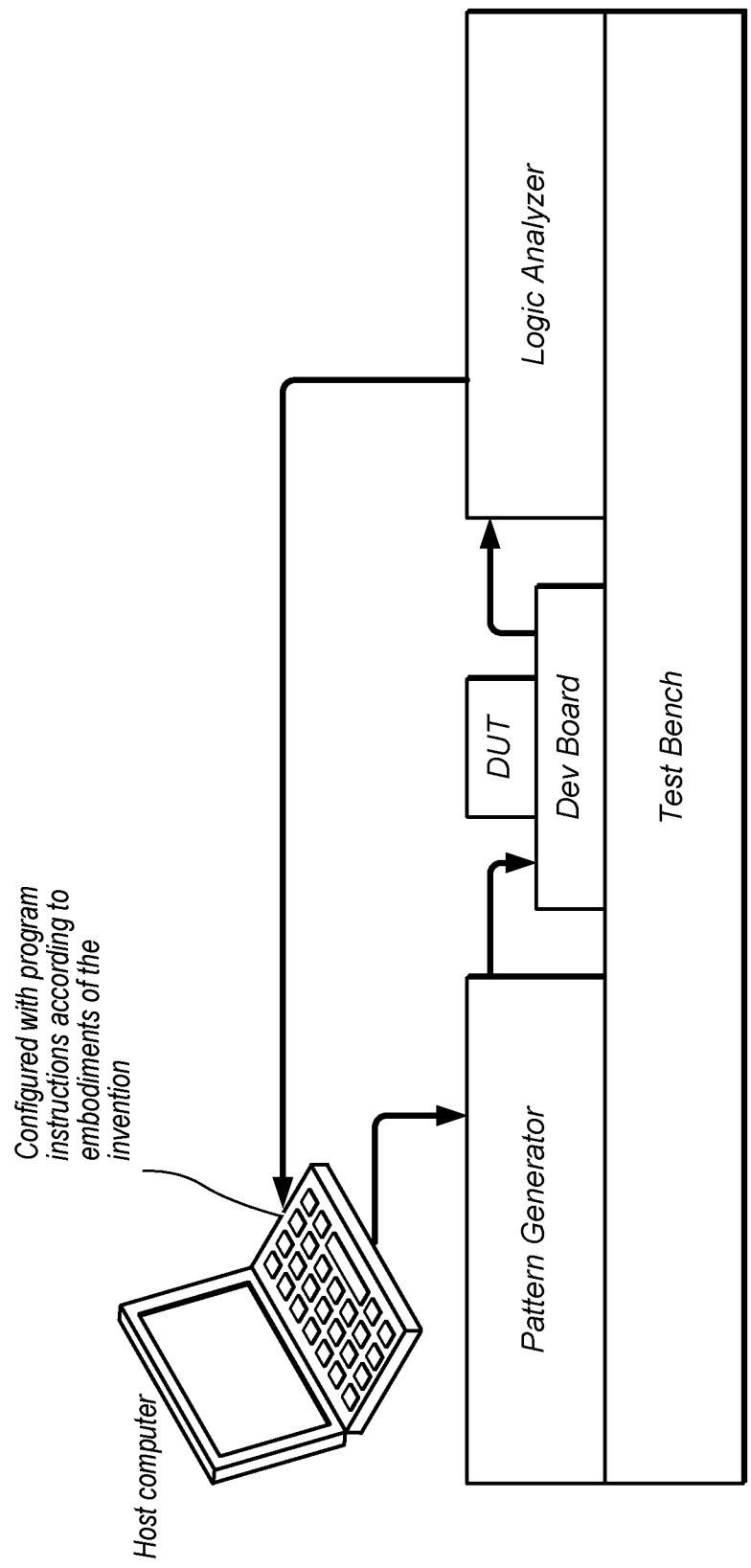
FIG. 10 illustrates a software defined test bench, according to one embodiment.

FIG. 10 is a high level illustration an exemplary system for testing a DUT that includes an MPA executing application software, according to one embodiment. As may be seen, this system differs from the prior art system of FIG. 7 at least for the reason that the host computer implements at least a portion of the novel techniques disclosed herein. More specifically, the host computer is configured with program instructions executable to perform embodiments of the novel methods disclosed herein, e.g., configuring application software and/or external testing code to duplicate (and possibly filter or otherwise process) at least a subset of data generated by application software during execution, and convey the (at least a subset of) data to the MPA's boundary for debugging or analysis, e.g., by programming hardware resources of the MPA that are not used by the application software during normal use, i.e., outside the testing/debugging environment or context, as described below in detail. This duplicated and/or filtered or otherwise processed data may be referred to herein as "auxiliary data" or "auxiliary stream data". Note that in various embodiments, the filtering may include sampling the data, and so the auxiliary data may be a smaller amount than the original data. In another exemplary embodiment, the filtering may include reducing the data, e.g., by averaging the data to produce lower resolution data that corresponds to the original data. Any other kinds of filtering (processing) may be used as desired.

Exemplary Innovative Features

One valuable characteristic of the above RTA system concept is the ability to probe high-bandwidth data flows in the DUT with negligible or no impact on application performance. This may be possible because the software probes developed for the software development tools may add very little code and execution cycles to the DUT—typically less than 1%. Because the application software typically does not consume all available MPA resources, nor all of the allotted time to process a block of data, a 1% increase in cycles, power dissipation, and/or memory use is nearly invisible.

A software probe may do at least two things: duplicate the reading of (and possibly filter or otherwise process) at least a portion of a block of data from a stream, and write that data to an otherwise unused buffer on the MPA. In some embodiments, a PE may do this, but a hardware DMA engine is much more efficient (dissipates less power), and so in other embodiments, a DMA engine may be used wherever possible.

With access to high bandwidth data streams, a major issue is what to do with all the data produced by a tap. In some embodiments, such data may be filtered and subsampled as soon as possible. Thus, in one embodiment, an otherwise-unused PE on the MPA with access to the auxiliary stream data buffer or the probe stream may be programmed to filter and down-sample the data, send the resulting data to a parallel port, and onward to the host computer. In some cases, the subsampling may be accomplished wholly by the DMA engine that is tapping the data stream.

The same or another otherwise-unused PE may provide other test control functions needed on-chip to support the RTA system. These may include the generation of synthetic signals and noise to use as test stimuli or for channel impairments.

In some embodiments, the host computer may include software that supports constellation diagrams for different modulations, e.g., quadrature amplitude modulation (QAM), and since the input stimuli are controlled, the software can accumulate bit error rate, packet error rate, etc. In some embodiments, the software may be configured to compare specified ideal signals with actual signals for vector signal analysis.

In some embodiments, the host computer may adapt or otherwise modify an experiment while the experiment progresses to make it more efficient. For example a sweep of signal-to-noise ratio (SNR) from high to low can begin with low packet count for high SNR and change to higher packet count for lower SNR, preserving some confidence requirement along the way.

Note that since the system runs completely in software, stimuli can be applied and results can be accumulated as fast as the DUT will operate on the MPA chip. If the MPA is clocked faster than the product design value, the results can be accumulated faster than the design objective's "real time".

Exemplary Embodiments and Implementations

The following describes various exemplary embodiments and implementations of the techniques disclosed herein. However, it should be noted that the particular embodiments and techniques described do not limit the invention to any particular form, function, or appearance. For example, some of the embodiments are described using specific terms, syntax, or elements; however, the terms, syntax, and particular elements described are meant to be exemplary only, and are not intended to limit the embodiments contemplated to any particular set of names, syntax, form, structure, or appearance.

Figure 11:
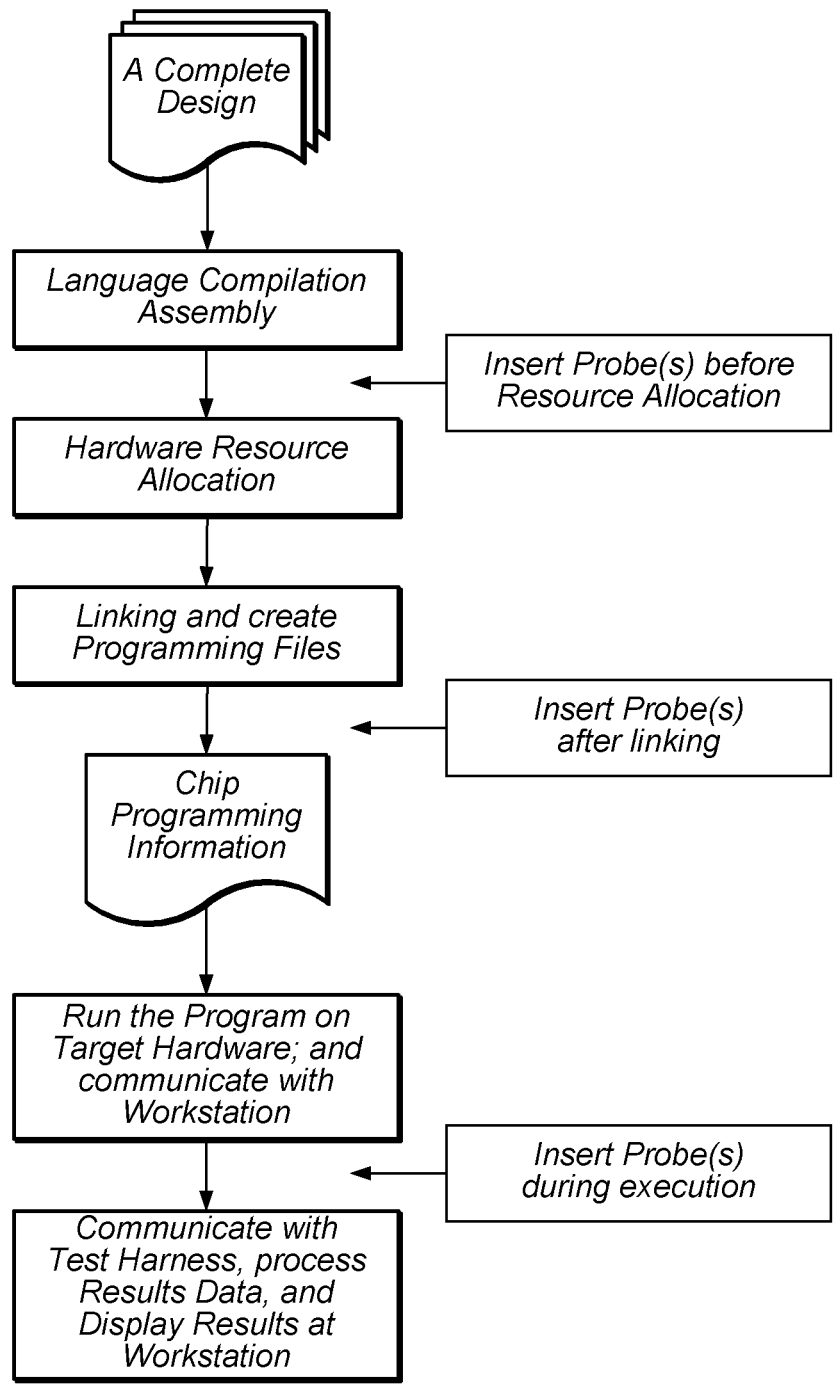
FIG. 11 flowcharts a method for developing software for a multiprocessor system, according to one embodiment.

FIG. 11—Flowchart of Method for Software Development

FIG. 11 is a flowchart diagram of an exemplary method for developing software for a multiprocessor system, according to one embodiment. More specifically, FIG. 9 illustrates exemplary locations in the flow where probes can be inserted. As noted above, the techniques disclosed herein may be implemented via a tool, which itself may include multiple tools or modules. In some embodiments, the tool may be invoked from or within the ISDE, while in other embodiments, the tool may operate as a standalone tool. In some embodiments, the tool may be implemented as a toolkit of callable functions and/or defined structures, or as a software suite.

Figure 5:
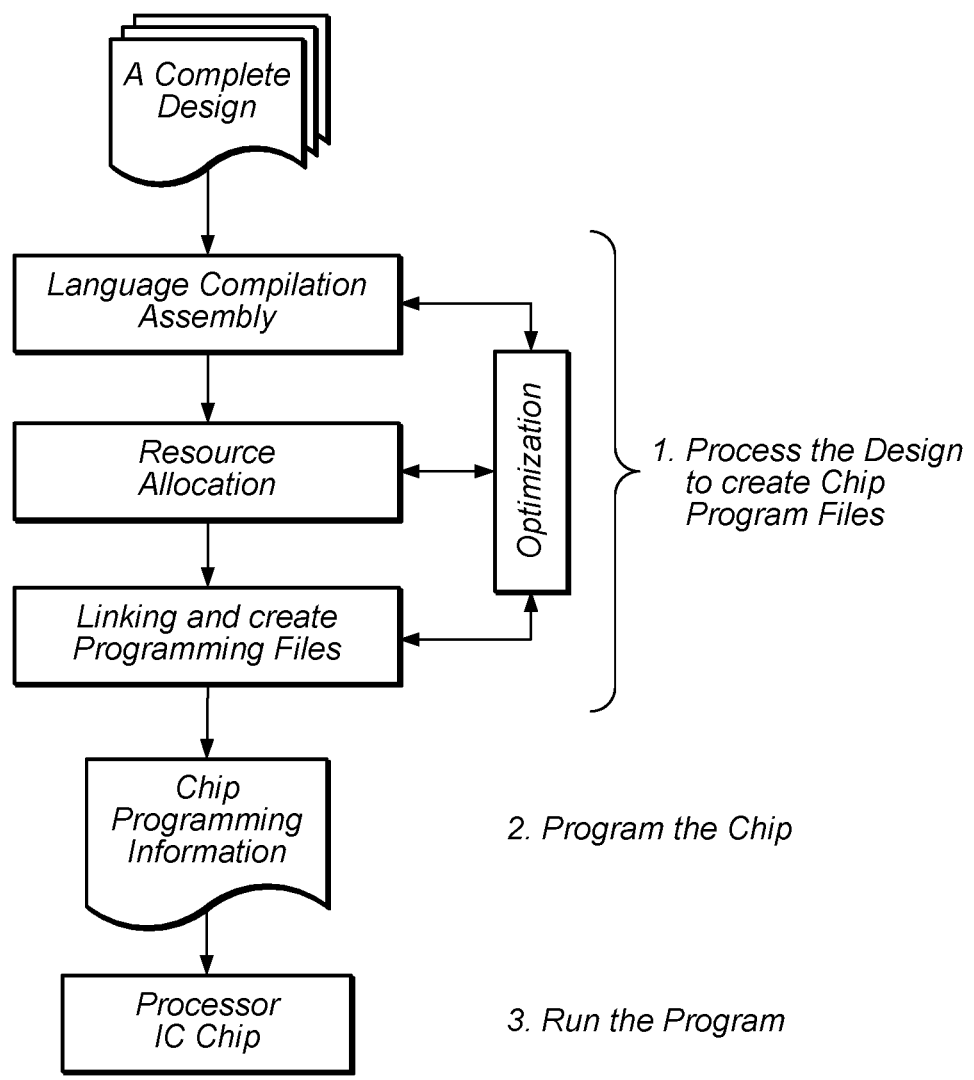
FIGS. 5 and 6 are flowcharts illustrating software development flow for MPAs, according to the prior art.
Figure 6:
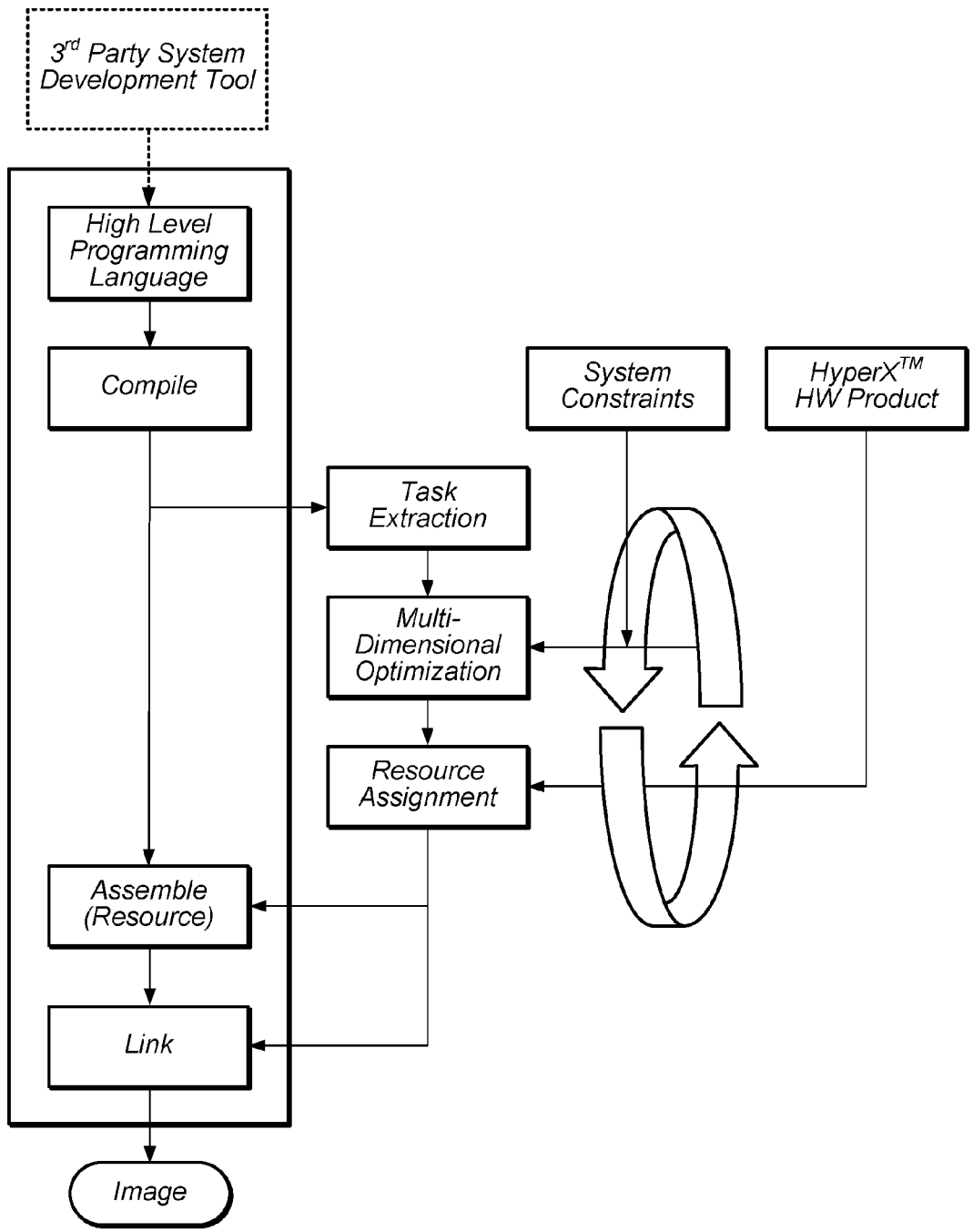

As shown in FIG. 11, similar to the flowchart of FIG. 5, the method may include reception of a complete design for a software application (e.g., in a high level programming language), as well as "language compilation/assembly", where a compiler is used to translate source code into modular address-relocatable object code, an assembler is used to create modular machine code; and finally, a linker is used to create an executable binary image of the entire program. Optimization may also be performed in and between any of these stages. As noted above, this process of compiling, assembling, and linking (making a binary image), including optimization, labeled "process the design to create chip programming files", may be automated with instructions to the operating system stored in "make files". To test the program, the binary image is generally loaded into the memory of the target device, represented in FIG. 11 by the provision and implementation of "chip programming information" for executing or running the application program on target hardware. As indicated, the program is run on the target hardware, and the method includes communicating with the workstation (host computer). As also shown, the method may include communicating with a test harness, processing results data, and displaying results on or at the workstation (host computer), although in some embodiments, in addition or instead, the results may be stored for subsequent viewing, e.g., locally, or to a storage device over a network.

As FIG. 11 further shows, one or more probes may be inserted at any of various points in the method. For example, in various embodiments, one or more probes may be inserted before resource allocation, after linking, and/or during execution, among others. It should be noted that in various embodiments, the probes may be inserted automatically, or may be inserted manually, e.g., by a user, e.g., a developer or tester, as discussed below.

In some embodiments, the tool may include a control program, configured to control a software defined test bench. The software defined test bench may be configured to test a device under test (DUT) and application software executing on the DUT in real time, where the DUT includes a multiprocessor array (MPA) that includes a plurality of processing elements, supporting memory, and a high bandwidth interconnection network (IN), communicatively coupling the plurality of processing elements and supporting memory. The software defined test bench may also be configured to provide input data, e.g., a test vector and/or signal streams, to stimulate the DUT, and receive data resulting from stimulation of the DUT. Additionally, or alternatively, the DUT may be configured to receive input data from an external signal or data source coupled to the DUT, i.e., real time signals, e.g., from a video camera.

Moreover, the software defined test bench may be configured to analyze (e.g., test) the DUT and the application software while the DUT is executing the application software in real time at full operational speed. In some embodiments, the software defined test bench may be configured to analyze the DUT and application software with zero impact on DUT and application software performance, while in other embodiments, the impact on DUT and application software performance may be non-zero, but negligible, i.e., small enough to be undetectable by users, too small to have a measurable impact on the application's operation, or within some specified tolerance, as discussed in more detail below. In one embodiment, the MPA may be configured to execute the software application (or application software) using a first portion of the MPA, and the tool may be configured to automatically configure one or more software probes onto a second portion of the MPA. To analyze the DUT and the application software while the DUT is executing the application software at full operational speed, the one or more software probes may be configured to read data from or write data to the software application during execution for analysis or control. Further details are provided below.

Real Time Debugging

In some embodiments, real time debugging may be implemented by inserting "debug probes" into the hardware DUT that is executing application run-time software to monitor internal signals. Ideally the debug probes should be completely non-invasive, i.e., should have no impact or effect on the operation of the user's application software in any way. In some situations this may be true; however, in most situations the effects will be negligible, and in some situations there may not be enough resources or there may be security barriers to probe insertion. Note that the terms "negligible effects" and "real time" may denote different tolerance levels, depending on the particular application domain or use considered. For example, in some embodiments, these terms may mean that the testing is performed with less than 1% impact on DUT and/or application performance. Similarly, in various other exemplary embodiments, the acceptable tolerance may be less than 0.1%, less than 0.5%, 1%, less than 2%, less than 3%, less than 4%, less than 5%, and so forth, e.g., per specified requirements. More generally, in various different embodiments, the acceptable tolerance (and thus, the meaning of "negligible" and "real time at full operational speed"), may be specified to be any value desired, as appropriate.

In one exemplary embodiment, a probe may be implemented as a task running on MPA hardware fabric, e.g., PEs and communication resources that are not used by the application software. The probes may stream desired data off the chip to either a development board and a connected PC that serves as a host machine for the software development tools, or a device such as a logic analyzer. On the host machine, the data may be put into a file, displayed graphically, and/or streamed to an attached device such as a speaker or a video monitor. The host machine may also provide test signal input data to the DUT at high speed, if not directly then by transfer of input data files to SDRAM adjacent to or near the DUT. For some tests the input data may be generated on the DUT, while in other cases external signal generators may be used.

Probes for digital signals may be implemented many different ways. In some embodiments, a probe may include a sampling part, a data processing part, and a chip output part. In some embodiments the MPA may form or format the data into packets for sending data to the host machine, while in other embodiments, the MPA may send data to another chip for this purpose.

Auxiliary Send

One exemplary way to implement the sampling part of a probe is to find in a PE task a first "send" statement for the signal of interest, and then insert after the first send a second (auxiliary), send statement for the same signal, but have the associated communication pathway exit the DMR from a different direction, and directed along a free pathway to a chip I/O port. The task containing both send statements may be recompiled and linked with the rest of the application software to create a binary image with the signal tap for test and analysis. Then, each time the sending task sends a block of data of the signal of interest, it also sends a block of the same data to the probe. This may not completely meet the requirement that the probe be non-invasive, because the sending task has to execute the second send, which adds cycles to execute the task. However, if the second send makes use of hardware resources not used by the application software, such costs may be ameliorated. For example, if the second (auxiliary) send statement uses a DMA engine, the PE may only be delayed a few PE clock cycles to write the DMA control registers, and then the PE can continue on with the application task. Usually these extra cycles are negligible compared to the time allocated to the task. As another example, in some embodiments, the second or auxiliary send statement may utilize an on-chip network to provide the probe data to the edge of the MPA.

Figure 12:
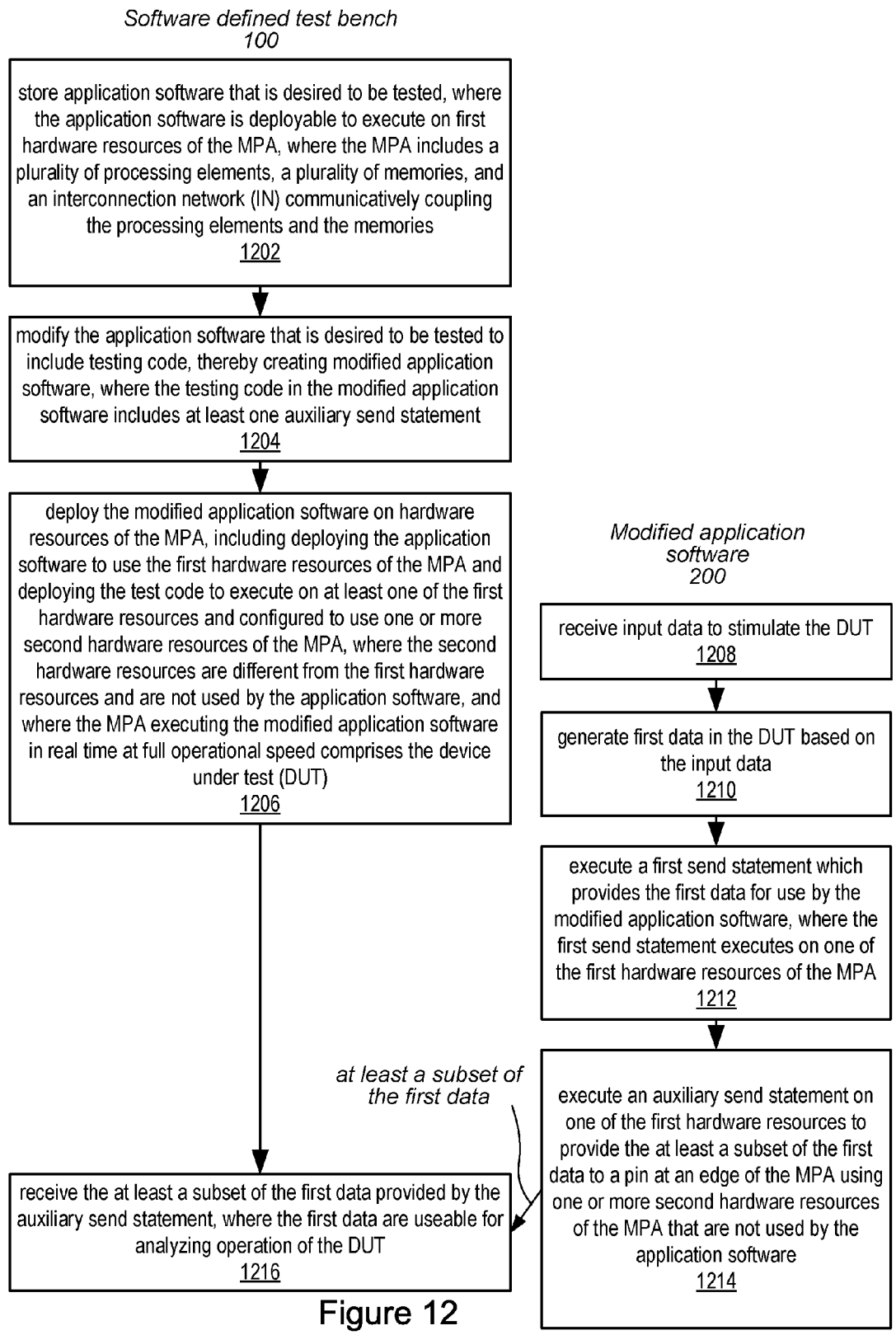
FIG. 12 flowcharts a method for testing a DUT that uses auxiliary send statements in the application software, according to one embodiment.

FIG. 12 is a high level flowchart of a method for testing a device under test (DUT) using auxiliary send statements, according to one exemplary embodiment. The DUT includes a multiprocessor array (MPA), various embodiments of which are described above. The method shown in FIG. 12 may be used in conjunction with any of the computer systems or devices shown in the above Figures, among other devices. In the exemplary embodiment shown, the method is performed in part by the software defined test bench, and in part by (modified) application software executing on the MPA, as indicated in FIG. 12 by the labels "software defined test bench 100" and "modified application software 200".

In various embodiments, some of the method elements shown may be performed concurrently, in a different order than shown, or may be omitted. Additional method elements may also be performed as desired. As shown, this method may operate as follows.

First, in 1202, application software that is desired to be tested may be stored, e.g., in a memory medium. The application software may be deployable to execute on first hardware resources of the MPA. The MPA may include a plurality of processing elements, a plurality of memories, and an interconnection network (IN) communicatively coupling the plurality of processing elements and the plurality of memories, as discussed above.

In 1204, the application software that is desired to be tested may be modified to include testing code, thereby creating modified application software. The testing code in the modified application software may include at least one auxiliary send statement.

In some embodiments, the testing code may be included in the application software automatically, i.e., without direct user input invoking or performing the inclusion, e.g., by the software defined test bench. For example, the application software may be analyzed to locate the first send statement in the application software, and the auxiliary send statement may be automatically inserted in the application software proximate to the first send statement. Moreover, in some embodiments, the application software may be analyzed to locate to locate a plurality of send statements in the application software, and a corresponding one or more auxiliary send statements may be automatically inserted in the application software proximate to respective ones of the plurality of send statements. Thus, the testing code may include a plurality of auxiliary send statements. Note that in some embodiments, the user may select or indicate which send statements in the application software are of interest, and auxiliary sends may be inserted automatically accordingly.

In other words, the user may specify which send statements (or signals/data of interest) are to be probed, and the method or tool may automatically insert a respective one or more auxiliary sends proximate to each selected or indicated send statement.

In other embodiments, the testing code may be included in the application manually by a user, e.g., the user may insert the testing code into the application software, e.g., via an editor, or by a process other than the software defined test bench. In further embodiments, various combinations of automatic and manual techniques may be employed. For example, the tool may automatically discover or locate the send statements, the user may indicate or select those of interest and manually insert auxiliary send statements accordingly. In other embodiments, the user may manually determine the locations of send statements and determine which are of interest, and the auxiliary sends may be inserted manually or automatically.

In 1206, the modified application software may be deployed on hardware resources of the MPA. This deploying may include deploying the application software to use the first hardware resources of the MPA and deploying the test code to execute on at least one of the first hardware resources and configured to use one or more second hardware resources of the MPA, where the second hardware resources are different from the first hardware resources and are not used by the application software. The MPA executing the modified application software in real time at full operational speed may comprise, i.e., include, be, or be included in, the device under test (DUT).

In some embodiments, the modified application software may be deployed on first hardware resources of the MPA automatically, e.g., by the software defined test bench. In other embodiments, the modified application software may be deployed on first hardware resources of the MPA by some other agent, e.g., manually by a user, or by a process other than the software defined test bench.

In 1208, input data may be received by the modified application software to stimulate the DUT. In some embodiments, at least some of the input data may be provided by the software defined test bench, e.g., by the host computer, to stimulate the DUT. For example, the software defined test bench may provide a test vector that includes a set of input data for the DUT/application software, and may include any type and number of data or signals desired.

Additionally, or alternatively, in some embodiments, the DUT may receive input data from an external signal (data) source coupled to the DUT, e.g., via the development board. In one embodiment, the external signal source may provide real time and/or real world data to stimulate the DUT. In other words, the DUT may receive real time data from an external signal source coupled to the DUT to stimulate the DUT. Examples of external signal sources include, but are not limited to, video cameras, network devices, such as routers, modems, hubs, etc., sensors, other systems, and so forth, among others. Note that in various embodiments, any type of external signal source may be used as desired.

The MPA may execute the modified application software in real time at full operational speed. In other words, although the DUT/MPA and application software are being tested, the modified application software may execute as fast (or effectively as fast) as during normal operation. As explained above, executing the modified application software "in real time at full operational speed" means that the performance of the system when executing modified application software is within some specified tolerance of the performance of the system during normal operation, e.g., when not being tested or debugged, e.g., within 0.1%, 0.5%, 1%, 2%, 4%, 5%, and so forth, as desired or required. More generally, as also noted above, the acceptable tolerance may be specified to be any value desired, as appropriate, thereby defining "in real time at full operational speed" for any particular application. Thus, the techniques disclosed herein may be used to analyze the DUT with negligible impact on system performance, including performance of the DUT executing the application software.

In 1210, first data may be generated in the DUT by the modified application software based on the input data. In other words, in response to the input data, the modified application software executing on the MPA may generate first data (which in some embodiments may also be considered a signal). In some embodiments, the generated first data may initially be stored in local memory in or adjacent to the processing element of the MPA that computed the first data, e.g., in a register or memory of an adjacent DMR.

In some embodiments that utilize the first DMA engine to provide the at least a subset of the first data, the generating may include storing the first data in a first memory of the MPA, where the first memory is one of the first hardware resources used by the application software, and where a plurality of DMA engines are associated with the first memory, including the first DMA engine that is one of the one or more second hardware resources. Moreover, in one embodiment, a second DMA engine may also be associated with the first memory, where the second DMA engine is one of the first hardware resources used by the application software.

In 1212, a first send statement may be executed by the modified application software, where the first send statement provides the first data for use by the modified application software. In other words, the modified application software may execute the first send statement to provide the first data to some other portion or function of the modified software application. The first send statement may be executed on one of the first hardware resources of the MPA.

In 1214, an auxiliary send statement may be executed by the modified application software on one of the first hardware resources provide at least a subset of the first data to a pin at an edge of the MPA using at least one of the second hardware resources. For example, in one embodiment, executing the auxiliary send statement (to provide at least a subset of the first data to a pin at an edge of the MPA) may program a first direct memory access (DMA) engine of the MPA to provide the at least a subset of the first data to a pin at an edge of the MPA, where the first DMA engine is one of the one or more second hardware resources of the MPA that is not used by the application software. This offloading of the data transfer of the first data (from the first hardware resources) onto the first DMA engine may thus prevent performance of the data transfer from degrading the operational performance of the executing (modified) application software (beyond the specified tolerance, as explained above). Thus, the auxiliary send statement may operate to "tap" the application software unobtrusively via one of the second hardware resources, e.g., the first DMA engine, thereby generating a copy of the first data for analysis purposes.

In one embodiment, the first data may be provided for use by the modified application software via a first data path through the IN of the MPA, and the first data may be provided to the pin at an edge of the MPA via a second data path through the IN of the MPA, where the second data path is different from the first data path.

In 1216, the first data provided by the auxiliary send statement may be received, e.g., by the software defined test bench (e.g., host computer), e.g., via the pin at the edge of the MPA. The received first data may be useable for analyzing operation of the DUT, e.g., for testing and debugging the application software.

As noted above, in some embodiments, various of the above method elements may be performed by a software defined test bench. For example, in one exemplary embodiment, the above modifying and receiving may be performed by the software defined test bench, where the software defined test bench tests the DUT with negligible impact on DUT performance.

Describing important aspects of the above method in a slightly different way, in some embodiments, a memory medium may store application software configured to be deployed on and/or use first resources of a multiprocessor array (MPA), where the MPA includes a plurality of processing elements, a plurality of memories, and a high bandwidth interconnection network (IN) communicatively coupling the plurality of processing elements and the plurality of memories. The memory medium may further include program instructions executable by a processor to modify the application software that is desired to be tested to include testing code, thereby producing modified application software, where the testing code in the modified application software includes at least one auxiliary send statement. As noted above, the testing code may be configured to use one or more second different resources of the MPA, where the one or more second different resources are not used by the application software, and where the MPA executing the application software comprises a device under test (DUT).

The modified application software executing on the MPA may be configured to: receive input data to stimulate the DUT, generate first data in the DUT based on the input data, execute a first send statement to provide the first data for use by the modified application software, and execute an auxiliary send statement to program a direct memory access (DMA) engine of the MPA to provide the first data to a pin at an edge of the MPA, where the DMA engine is one of the one or more second resources of the MPA. The program instructions may be further executable to receive the first data resulting from the DMA engine, where the first data are useable for testing the DUT.

Considering the above technique from the perspective of the application software, a memory medium may store program instructions executable in a multiprocessor array (MPA), where the program instructions include application software and testing code inserted into the application software. The program instructions may be executable to: receive input data, generate first data based on the input data, execute a first send statement in the application software to provide the first data for use by the application software, and execute at least one auxiliary send statement from the testing code inserted into the application software to program a first direct memory access (DMA) engine of the MPA to provide the first data to a pin at an edge of the MPA. As also noted above, the first DMA engine may be a hardware resource of the MPA not used by the application software. The first data may be useable for analyzing the DUT.

Embodiments of the above method utilize an auxiliary send statement inserted in the application software to program an otherwise unused or idle DMA engine on the MPA to extract data (or a signal) of interest from the executing application software for provision to the edge of the MPA without significantly impacting performance of the system.

Other techniques for duplicating and extracting such data or signals are also contemplated, and are described below.

External Testing Code

Figure 13:
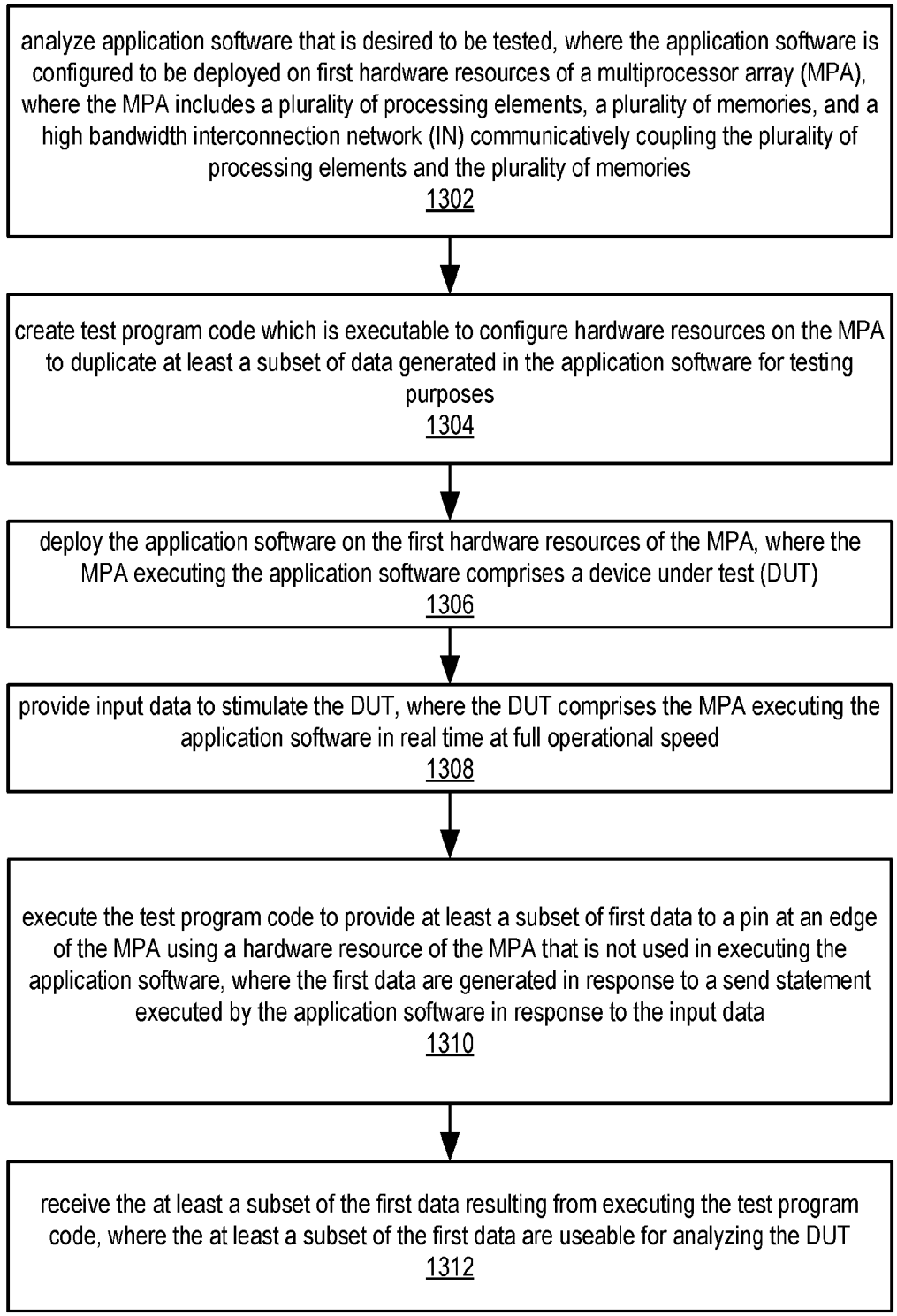
FIG. 13 flowcharts a method for testing a DUT that uses testing code external to the application software, according to one embodiment.

FIG. 13 is a high level flowchart of a method for testing a DUT that uses testing code (which may also be referred to as test program code) external to the application software, e.g., in contrast with the use of the auxiliary send statements of FIG. 12, to duplicate and extract data or signals of interest from the MPA, according to one exemplary embodiment. As with the method of FIG. 12, the DUT includes a multiprocessor array (MPA), various embodiments of which are described above. The method shown in FIG. 13 may be used in conjunction with any of the computer systems or devices shown in the above Figures, among other devices. In various embodiments, some of the method elements shown may be performed concurrently, in a different order than shown, or may be omitted. Additional method elements may also be performed as desired. As shown, this method may operate as follows.

First, in 1302, application software that is desired to be tested may be analyzed. The application software may be configured to be deployed on first hardware resources of a multiprocessor array (MPA). As with the method of FIG. 12, the MPA includes a plurality of processing elements, a plurality of memories, and a high bandwidth interconnection network (IN) communicatively coupling the plurality of processing elements and the plurality of memories. For example, in one embodiment, the software defined test bench may automatically analyze the application software to determine where and/or when data or signals of interest are generated.

In 1304, test program code may be created which is executable to configure hardware resources on the MPA to duplicate at least a subset of data generated in the application software for analysis (e.g., testing) purposes. In some embodiments, the creation of the test program code may be automatic, e.g., may be performed by the software defined test bench without direct user input specifying the code. In other embodiments, a user may create at least a portion of the test program code, e.g., via an editor of the software defined test bench or a program development environment.

In 1306, the application software may be deployed on the first hardware resources of the MPA, where the MPA executing the application software comprises a device under test (DUT).

In 1308, input data may be provided to stimulate the DUT. The DUT may comprise the MPA executing the application software in real time at full operational speed, as discussed above. Similar to the above method, in some embodiments, the DUT may receive real time data from an external signal source coupled to the DUT to stimulate the DUT, e.g., as input data.

In 1310, the test program code may be executed to provide at least a subset of first data to a pin at an edge of the MPA using a hardware resource that is not used in executing the application software. The first data may be (or have been) generated in response to a send statement executed by the application software in response to the test vector. In some embodiments, executing the test program code (to provide at least a subset of the first data to a pin at an edge of the MPA) may program a first direct memory access (DMA) engine of the MPA to provide the at least a subset of the first data to a pin at an edge of the MPA, and the first DMA engine may be a hardware resource of the MPA that is not used in executing the application software. Said another way, during execution, the application software may execute a send statement that generates the first data in response to the input data, after which the test program code may be executed which programs a DMA engine of the DUT to transfer a copy of at least a subset of the first data to the pin at the edge of the MPA.

As noted above, in various embodiments, the method may include filtering or otherwise processing the first data. For example, the test program code or a hardware resource (of the second hardware resources) programmed or controlled by the test program code, may filter the first data or a subset thereof. The filtering may include sampling the data, and so the auxiliary data may be a smaller amount than the original (first) data. In another exemplary embodiment, the filtering may include reducing the data, e.g., by averaging the data to produce lower resolution data that corresponds to the original data. Any other kinds of filtering (processing) may be used as desired, including smoothing, removing outliers, etc., as desired.

In 1312, the at least a subset of the first data resulting from execution of the test program code may be received, e.g., by the software defined test bench. The at least a subset of the first data may be useable for analyzing the DUT. Various embodiments of the MPA and DUT are described above in detail.

In some embodiments, the test program code may execute on a processing element of the MPA that is not used in executing the application software, e.g., on a processing element that neighbors the memory in which the first data are stored. In other embodiments, the test program code may execute on a computer system separate and distinct from the MPA, i.e., an external computer system. As indicated above, in some embodiments, the test program code may further operate to filter or otherwise process the data, e.g., sampling, reducing, etc., as desired.

In one embodiment, the test program code may provide commands over a serial bus (or other secondary interconnection network (SIN)) within the MPA for providing the at least a subset of the first data. For example, in an embodiment that utilizes the first DMA engine as described above, the first DMA engine may be programmed by external test program code (or testing code) via a serial bus (or other secondary interconnection network (SIN)) of the MPA.

The first data generated by the send statement may be provided for use by the application software via a first data path through the IN of the MPA, and the at least a subset of the first data may be provided to a pin at an edge of the MPA, e.g., by the DMA engine, via a second data path through the IN of the MPA, where the second data path is different from the first data path.

In some embodiments, the analyzing of 1302 and the receiving of 1312 may be performed by a software defined test bench, where the software defined test bench tests the DUT with negligible impact on DUT performance Thus, in various embodiments, the software defined test bench and the application software may operate in conjunction to analyze the DUT (which includes the application software) while the application software is executed by the DUT in real time at full operation speed.

Figure 14:
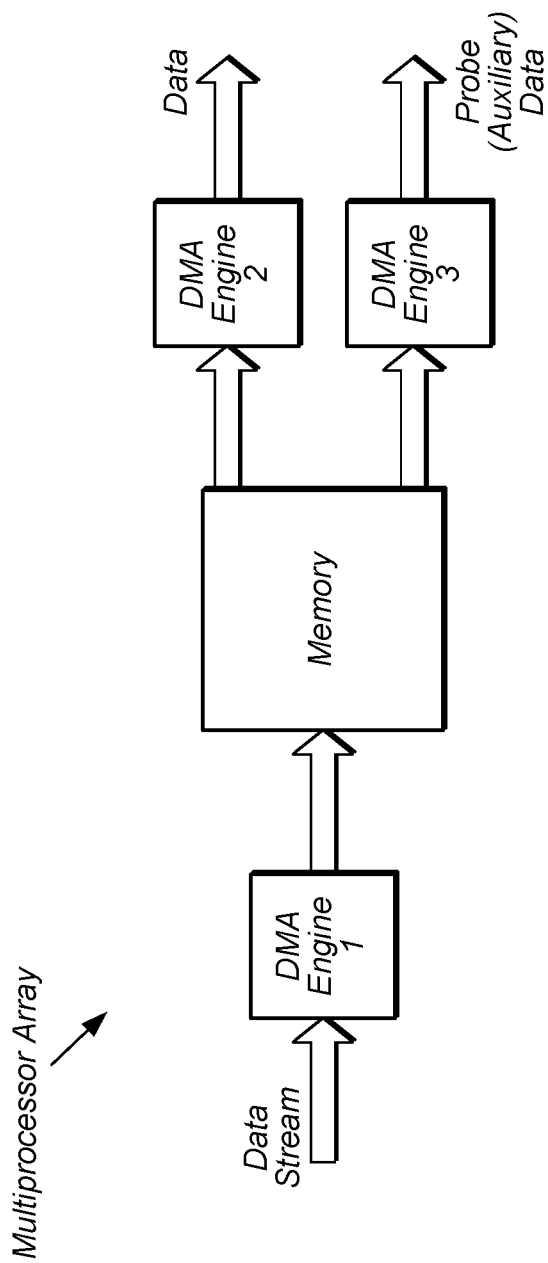
FIG. 14 illustrates use of DMA engines to split a data stream for use by a probe, according to one embodiment.

If the auxiliary (or second) send command or external testing code does employ a DMA engine to perform the data transfer, a pathway may be set up that may be structured so as to move a block of data from a buffer in SM over the IN to a chip I/O port. The first several words of data transfer may be header information to set the pathway. FIG. 14 illustrates an exemplary system whereby data are streamed to a first DMA engine, labeled "DMA engine 1", which transfers the data to memory, after which DMA engine 2 streams the (original) data to its specified target, and DMA engine 3 streams the copy of the data, i.e., auxiliary data, referred to here as "probe data", e.g., for analysis.

Additionally, in some embodiments, the data may be processed enroute to the chip I/O port by buffering at a free DMR, where the term "free" means "not necessary to execute the application software". A free PE neighboring the free DMR may be programmed to process this data (such as decimation or compression). Another communication pathway may be set up to conduct the data to a chip I/O port and thence to the host machine.

Polling of Registers

Another, less intrusive but more complex, method for duplicating/extracting data or signals of interest utilizes a neighboring PE to poll a set of registers associated with a particular DMA transfer. Once the neighboring PE detects the transfer beginning, it can read the same data and stream it off the chip. This can be done in a non-invasive way because the priorities can be set on the DMA registers so that the neighboring PE has lowest priority, and thus never interferes with the operation of the application software. So, while the data are being sent the probe may be trailing behind the DMA engine and may occasionally be stalled by the engine or other neighboring PEs in the application which are accessing the same DMR. This may conspire to cause the neighboring PE to finish reading the data some number of cycles after the DMA engine has finished and has notified the application's sending PE. During that small time window, the sending PE may begin modifying the data. However, it is more common to have relatively long intervals between bursts of DMA transfers, and so the likelihood of reading invalid data is small.

Use of DMA-FIFO

Figure 15:
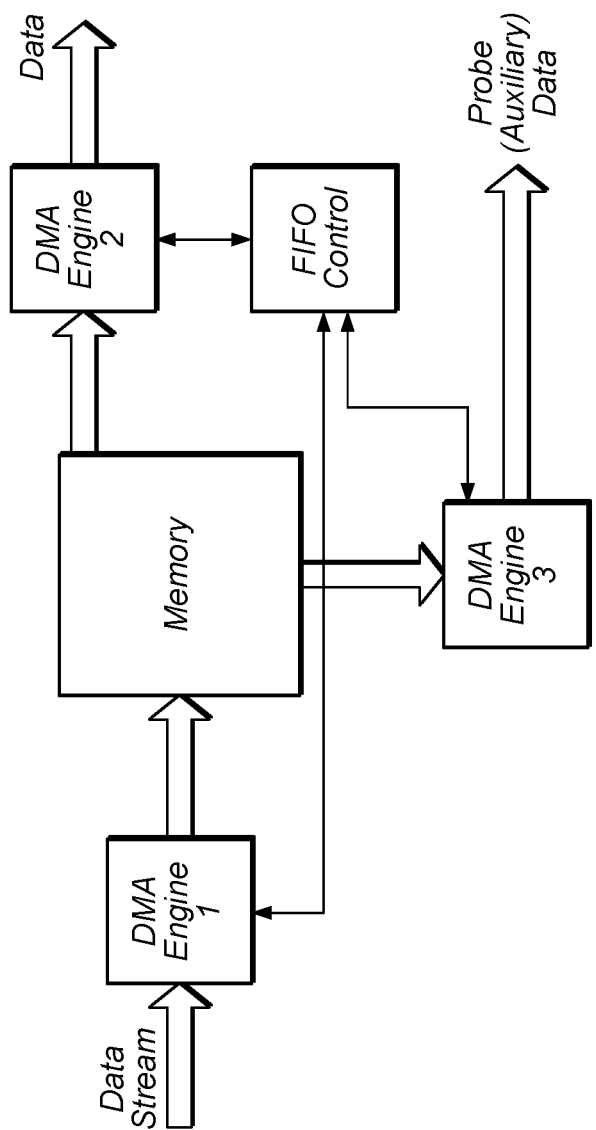
FIG. 15 illustrates use of DMA engines to split a data stream for use by a probe with FIFO control for sampling, according to one embodiment.

An even less intrusive probe may be implemented using onboard DMA-FIFO functionality provided by some MPAs, e.g., the DMA-FIFO capability of the hx3100B HyperX [MPA] processor chip. In this approach, three DMA engines may be coupled together with a first-in first-out (FIFO) control block to split a stream of data into a primary or original data stream and a probed or auxiliary data stream, as illustrated by FIG. 15.

As may be seen, in this exemplary embodiment, data are streamed to memory via DMA engine 1, and DMA engine 2 streams the data from the memory to its specified target, and DMA engine 3 streams the probe data, i.e., auxiliary data, e.g., for analysis. Note, however, that in contrast to the approach of FIG. 14, in this embodiment, a FIFO control element or component is interposed between all three DMA engines, whereby the operation of the DMA engines may be coordinated so as to prevent data loss or data duplication. Data flow control may be preserved throughout, so that the well-known technique of "double buffering" may be not needed.

Note that if a probe is allocated to MPA resources (physical design) at the same time as an application then it may perturb the physical layout of the application and thereby cause it to have different behavior. The different behavior may come about in two different ways.

If the probe is of the first type (i.e., it is monitoring an inserted debug send), the added routing resources may cause the application design to have a different set of routes which may alter the designs performance and, in the worst case, may cause different behavior. Second, if the probe is directly monitoring the DMA transfer by accessing the DMA registers, it may be required to be physically adjacent to the appropriate DMR. This may cause the layout of the application design to be perturbed. In the best case, the processor that the probe is using was not originally occupied by the application design. However, even in this case the probe could alter the application design if it accesses any of the other DMR memories and causes a different pattern of local memory conflicts. This can be dealt with by changing the priorities on those DMRs so that the probe always has the lowest priority. However, even if this is done, the probe still needs to send its data off the chip, and so it will need to use routing resources, and again potentially perturb the application design.

Note, however, that these issues regarding perturbation of the design may all be avoided if the probes are inserted post original design development, as discussed below.

One way to avoid such routing effects is to lock down ("freeze") the application routing before the probe is added and only allow the probe routing to pass through unused routing segments. Depending on the resources left in the MPA after the application design, this may or may not be possible.

Exemplary DMR of an MPA

Figure 17:
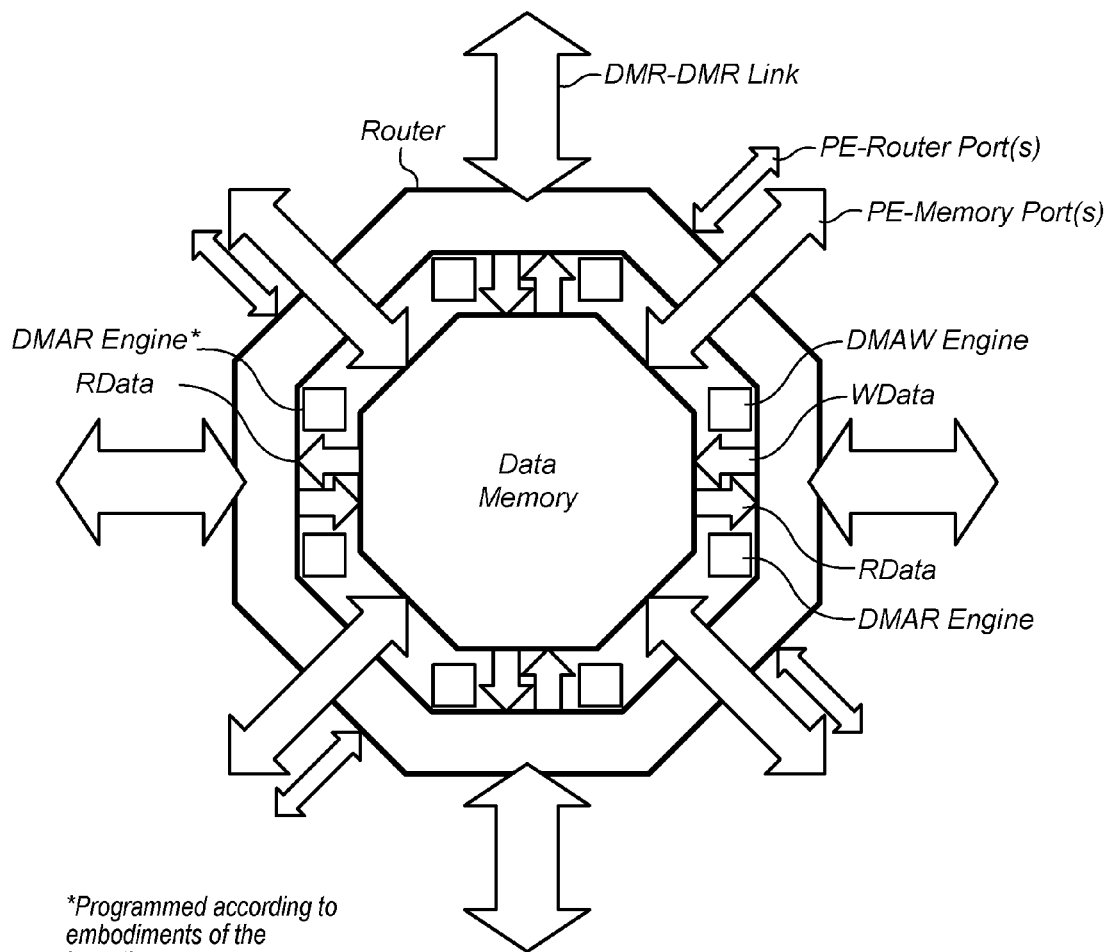
FIG. 17 illustrates a data memory and router (DMR) element of an MPA, according to one embodiment.

FIG. 17 illustrates an exemplary embodiment of a DMR of an MPA, according to one embodiment. As discussed above, DMRs in the MPA provide local memory and routing resources for adjacent processing elements of the MPA, and may implement DMA engines for reading and writing data to, from, and within, the executing application software. For example, the exemplary DMR of FIG. 17 includes four pairs of DMA engines, each pair including a DMA read engine for reading data from the data memory shown in the center of the DMR, and a DMA write engine for writing data from the data memory, each DMA engine represented by a respective square in the Figure, as indicated by the two rightmost squares in the DMR labeled "DMAW Engine" (DMA write engine), and "DMAR Engine" (DMA read engine), where the DMA write engine operates to write data (WData in the Figure) to the data memory, and the DMA read engine operates to read data (RData in the Figure) from the data memory.

As described above, some of these DMA engines may be utilized by the executing application software to read and write data for use by the application software, e.g., as part of the above described "first resources", whereas other DMA engines may be used by testing program code for testing or debugging, e.g., as part of the above described "second resources".

As FIG. 17 indicates, in this exemplary embodiment, the DMA read engine on the far left of the DMR is programmed according to embodiments of the present techniques. More specifically, this DMA read engine is programmed by testing code that is separate and distinct from the original (unmodified) application software, e.g., a auxiliary send statement or external testing code. Accordingly, the DMA read engine operates to duplicate and possibly filter data and send the (possibly filtered) duplicate data to a pin at the edge of the MPA (as described above), and because this resource is one of the "second resources" of the MPA, its operation is not at the expense of system performance (within some specified tolerance).

Application Design Post-Link Debug Probing

It may be of benefit to decouple the software communication probes from the application under test. One motivation for doing so is that the source code of the application may not be available, and thus cannot be re-linked (re-built) with the communication probes included. However, of much more importance is maintaining complete integrity of the application under test, such that no modifications, as small as they may be (i.e., probes), are introduced in the application. This also saves (prevents) having to re-build (re-link) the application with probes included.

The HyperX device may allow complete independent control of PEs and DMRs. Such flexibility may allow users to program and run additional PEs with execution code without disturbing an application that may already be running on the HyperX device, so long as the additional PEs loaded do not overwrite PEs and associated DMR memory space of the already-running application. This essentially allows for execution of multiple binary images concurrently (in parallel), as long as their resource utilization is mutually exclusive (i.e. PEs, DMR memory, and routing fabric). Loading and execution of different binaries (applications) can occur at different times. They may be loaded via the SIN, which is completely independent of the PIN routing fabric used by the application(s).

Figure 16:
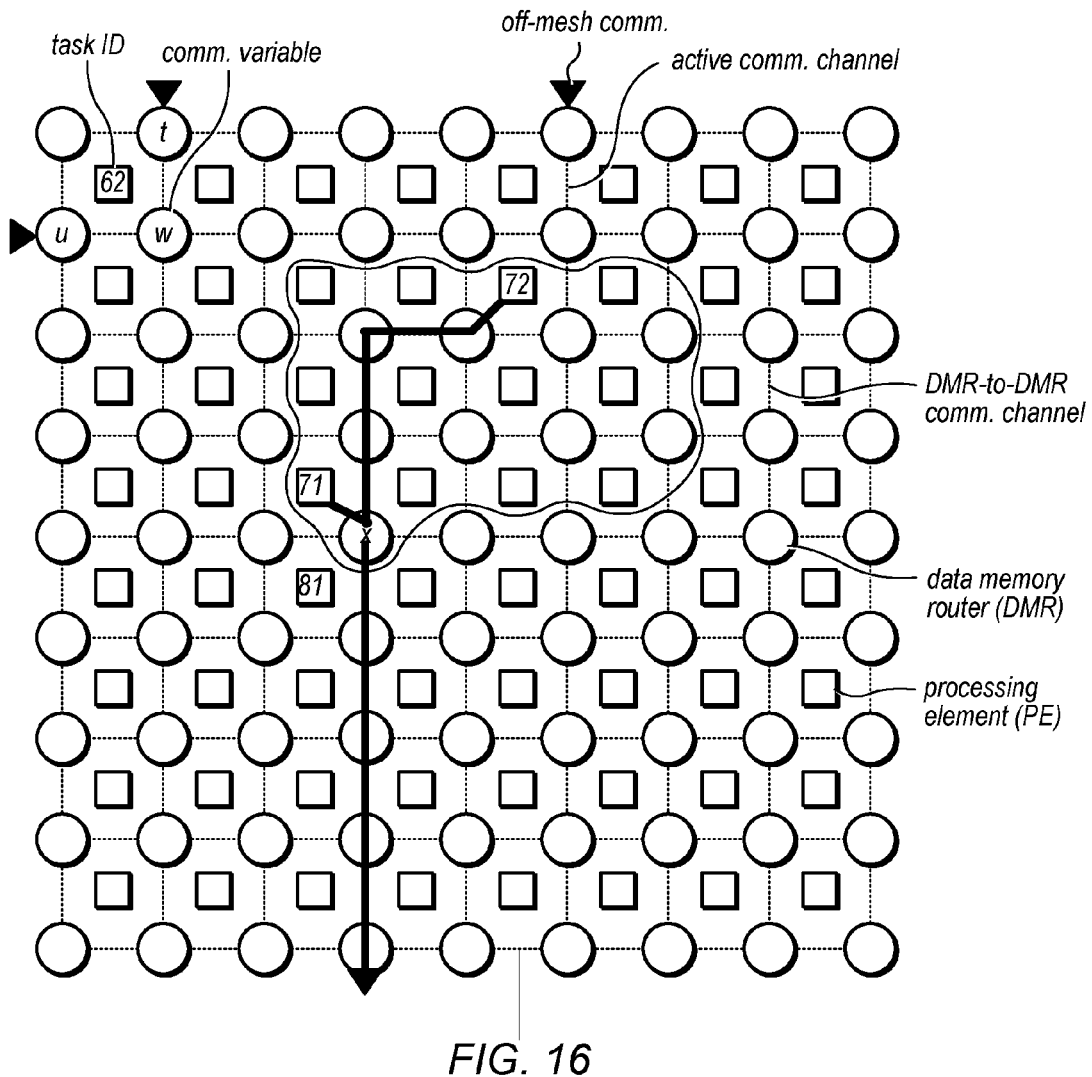
FIG. 16 illustrates a multiprocessor array with resources used for software instrumentation, according to one embodiment.

The flexibility of being able to load and execute different binary images at different times and then run them concurrently lends itself to decoupling the application under test from a binary image of probes to extract data from the application under test. In order to create a probe that taps into a communication pathway, a test PE next to the sender PE such that it has access to the source DMR may be allocated. For example, in the exemplary embodiment shown in FIG. 16, the application software uses resources encompassed by the freehand loop in the center of the MPA, which has inside it a pathway from a task 71 on a first PE to task 72 on a second PE. The DMR marked with an X is accessible from task 81 on a non-application PE. This test PE can set up a pathway from the DMR X to an output port, or to another PE for processing.

This test PE may be programmed to continuously poll the DMA (status) registers of the original data send transfer (from app under test). Whenever the test/polling PE detects a DMA status change from non-active to active, the test PE may copy the original DMA register values (i.e. TOTAL, WAIT, STRIDE) and program another DMA port (of the same DMR) with equivalent DMA register values. This may create an auxiliary DMA send transfer to be used as the probe. The application under test does not have to be stopped, does not have to be modified, and will not be affected in any way by the establishment of the probe DMA transfer.

Triggering

Test instruments such as a logic analyzer (LA) capture digital signals by sampling a large number of binary digital signals and storing them into high speed memory. Afterward the memory contents may be displayed on a screen as either a set of binary signals or as some equivalent numeric values. The time base of the logic analyzer (LA) begins a sweep of storage addresses at a trigger event. A trigger event may be a particular pattern of binary signals in a subset of the primary signals and other binary signals coming from either the device under test or a digital pattern generator feeding signals to the DUT.

Debugging Probe Insertion

Debugging probes are used to monitor signals which are internal to the users design (see above for a detailed explanation). Simulink™, provided by The MathWorks, Inc., provides a number of blocks used for debugging purposes. In particular there are blocks for sampling internal signals. In some embodiments, these built-in Simulink blocks may be used for inserting debugging probes into designs that are to be realized on the HyperX hardware. Such blocks may be translated, e.g., using C-code, to implement the capturing of data and sending it off chip. The translator may also setup the necessary infrastructure for routing the signals to the host machine and displaying the data in an appropriate fashion.

Debugging Probe Multiplexing

Often the number of probes that are needed for debugging may be larger than the number of data ports available on the MPA. In these cases, the data probes may be subsampled (if necessary to reduce bandwidth requirements) and then the data packets from multiple probes may be combined to form one data stream which can then use a single I/O port on the chip.

Note that when the signals are multiplexed, the identity of the data may be communicated to the host machine. This may be accomplished in any of a number of ways. For example, the probe data packets may be sent in strict repeated order so that the first packet corresponds to the first probe, the second packet to the second probe, the third packet to the first probe, the fourth packet to the second probe, etc.

In another approach the probe data packets may be tagged with identification numbers so that the host can read the packet ID and know which probe the data are from.

Communication Pathway Setup (COMMs)

The following describes exemplary programming expressions for the set up and teardown of communication pathways. It should be noted, however, that the particular implementations described are exemplary only, and are not intended to limit the implementations contemplated to any particular forms, functions, names, or appearances. Generally the PE(s) may perform these setup and teardown functions while DMAs are used to actually pump the data through a pathway from memory. Also, in some embodiments, the PE may pump data into a pathway directly by means of a "quick port", which bypasses memory.

The setup of a communication path generally involves the loading of a software task into a sender PE instruction memory and starting execution of the task. A pathway can be set up solely by a sender PE task, but at the destination DMR a receive mechanism is needed; otherwise the hardware stalls the forward motion of data. Suitable receive mechanisms are either another task on a PE near the DMR or a prepared DMA engine at the arrival port of the path.

A task may be programmed in a high level programming language, e.g., C; however in some embodiments, various constructs may be provided to ease the programming effort, e.g., MPX_constructs. For example, MPX_Send and MPX_Recv may provide send and receive functionality. A data transfer options parameter may control variations in the type of transfer and the implementation. Such MPX functions may support three general ways of communicating:

Generic—system chooses optimal communication (memcpy, message passing using DMA transfer, or quickport transfer);

DMA Transfer—message passing; and

Quickport—message passing of single words in which the PE writes to DMR quickport registers (does not use the data memory in the DMR and no need to set up DMA).

Within these general ways of communication, implementation variations give the designer many options, the following of which are exemplary embodiments.

Blocking—execution of the sending PE stops until data are completely sent out of the buffer;

Non-blocking—execution of the sending PE continues immediately;

InitRoute—Sets up the DMA route;

EndRoute—Tears down the DMA route—(note, non-blocking functions never tear down the route);

Express (send)—does not set up or tear down the route, allowing multiple express calls per explicit route already set up;

Expedited functions—use less code because invariant value registers can be preset once;

Single point to point communications; and

One-to-many (fan-out) and many-to-one (fan-in) communications.

A function blocks if it does not return until the action is complete. So, for a send function, complete means the data are completely sent out of the buffer; the data have left the DMR. Completion does not necessarily mean the data have been received by the receiving task. When a receive function blocks, the data may be required to be written to the memory at the DMR location. Only when the action is complete can resources specified in the call be reused and the receiving PE can continue execution.

A function is non-blocking if it returns before the operation is complete. Since the data transfer operation has not necessarily completed, data not yet sent may be modified erroneously by the sender task. The sender task may avoid data errors either by explicitly waiting for a completion signal or explicitly polling the status of the data transfer operation.

A communication pathway may be declared with a particular commID value, which is a constant, e.g.:

define COMMID 99.

Then the construct MPX_Send can be used to effect a data transfer.

MPX_Send

MPX_Send may transfer a specified number of elements (memory word values) to another task. The means of communication may be given by a transfer option(s) parameter, e.g., MPX_CommOptions_t. The following is an exemplary function prototype showing function and argument types:

```
int16_t MPX_Send ( void      *buf,
                   uint16_t   numElts,
                   MPX_Datatype_t datatype,
                   MPX_Comm_t     commID,
                   MPX_CommOptions_t transferOpt )
```

The following is a table of exemplary parameters specifying various functionalities of this structure:

TABLE 1

Parameters

| Parameter | Description | Type | |
|---|---|---|---|
| buf | initial address of data to transfer | void * | in |
| numElts | number of elements of the given type to send | uint16_t | in |
| datatype | data type of elements | MPX_Datatype_t | in |
| commID | communication ID | MPX_Comm_t | in |
| transferOpt | transfer option(s) | MPX_CommOptions_t | in |

Receive Functions

See the above explanation of the generic, DMA, and quickport transfers in the description of MPX "Send and Receive Functionality". Note that receive functions may never set up or tear down a route.

TABLE 2

| Function | Description |
|---|---|
| MPX_Recv | Receive buffer elements |
| MPX_RecvVal | Receive a value via a quickport communication |
| MPX_RecvAll | Receives from all senders with data stored in order of comms in the fan-in set (comm ID array) |
| MPX_RecvAny | Receives from any sender in the fan-in set |

Constraints

Constraints are specifications that may be used during the physical design phase to guide the allocation of resources. Constraints are used for example to guide the formation of one or more communication pathways in the IN, and other communication parameters. Constraints can be used to prevent pathway overlap, to force pathways to use particular resources, and to establish keep-out zones, amongst other purposes. A probe constraint is a particular type of constraint defined as follows.

```
//Create data probing constraint in a design view.
constraint create -type probe [-raw]
    -name constraintname
    -comm comm_id
    -port { PARALLELPORT | PCIE }
    [ -sample '{'offset stride count '}' ]
{ viewname | viewpath }
```

Data Probe Examples and Views

Data probes may facilitate extraction of data from an application to the real time analysis (RTA) views in the ISDE.

Probes may sample communication data and transfer the samples off-chip for analysis. Data from a design may be sampled without altering the design to insert sample points. Data may be filtered on-chip to minimize communication overhead.

Sampling may not affect the design's function and the affect upon timing may be be minimal.

In some embodiments, the real time analysis (RTA) tools may be implemented as a set of views in the HyperX ISDE that are used to analyze the sampled data.

Create a Probe

A probe may be created during the resource mapping stage of the build process. There are no changes to the source code, e.g., 'C' code.

A probe comm may be a non-blocking comm set up to transfer the probe's sampled data. The header required for each packet sent to the RTA may be automatically added to all probe comms.

A probe comm may be created by creating a constraint of type "probe". The constraint may include sampling criteria to control the frequency of probing.

An implicit non_overlapping_comm constraint may be provided by the system for the referenced and probe comm. A non-overlapping constraint tells the Resource Allocation tools to refrain from trying to share any of the links and routers assigned to a pathway with another pathway.

Example 1 constraint create -type probe -name probe99\
    -comm 99 -port PARALLELPORT/work/top/topv This example creates a probe comm named probe99, where comm 99 is the reference comm whose data are probed.

Example 2 constraint create -type probe -name probe99\
   -comm 99 -port PARALLELPORT\
   -sample {2 3 4}/work/top/topv This is the same example as above, except the -sample option controls the amount of sample data collected by specifying the offset (2), stride (3), and count (4). Suppose, for example, that the values transferred on comm 99 are:

1, 9, 25, 49, 81, 121, 169, 225, 289, . . . .

The first probe data would be 25, 121, 289, 529. The first element is 25 because offset zero would be the initial element and the element at offset 2 is 25. Since the stride is 3, the next element is 121. Finally, since the count is 4, two more elements are collected to complete this set of sample data.

The probe comm may require that the IOport be placed so that data can be transferred off-chip.

Example 3 place ioport -location {11 9}/work/top/topv/probe99
Create Probe for a Chip-to-Chip Comm In a multichip design, the probe can be established either before or after grouping. Grouping the design is the process of assigning parts of the design to groups, and then assigning the resulting groups to reside on particular chips. When the probe is established after grouping, the "sender side" group name may be used.

Example 4 group create -name grp0 -task/work/root/root/0
group bind -chip/clxlib/XHx/v/U1 grp0
constraint create -type probe\
   -name probe273 -port PARALLELPORT\
   -comm/work/root/root/273/work/root/root/grp0

This example creates a probe named probe273. It probes data from the reference comm 273 where the comm is part of group "grp0".

Real Time Analysis—Views

Real time analysis (RTA) may be used to control and monitor the behavior and performance of a product application in real time while running on the HyperX™ hardware.

In some embodiments, the RTA tools may be used as part of a test harness in the ISDE running the hardware debugger. Sample code may be provided, e.g., in an installation examples directory, to show how test components interface with application and ISDE views.

The below exemplary implementation focuses on analysis of radio applications.

Three Types of Views

In one exemplary embodiment, the real time analysis (RTA) tools for HyperX™ hardware includes six views, e.g., in the HyperX™ real time analysis perspective that operate as three pairs of views.

TABLE 3

| Control View | Display View |
|---|---|
| Error Rate Control | Error Rate Data |
| AWGN | Constellation |
| Video Source | Video Display |

RTA views may be used in the HyperX™ real time analysis perspective.

Software Defined Radio Example

Figure 18:
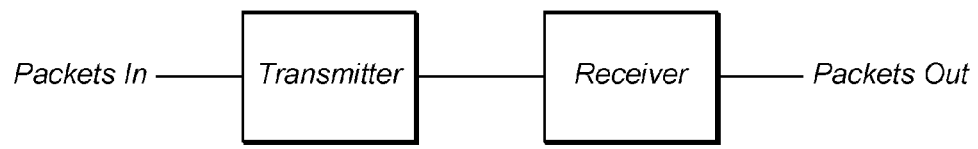
FIGS. 18 and 19 are a high level block diagrams of respective embodiments of a software defined radio.

Start with an example of a software defined radio, as shown in FIG. 18, in which packets are receive as input to a transmitter coupled to a receiver which outputs packets, where the transmitter and receiver each utilizes one or more PEs. The transmitter accepts fixed size packets, encodes them for transmission, and sends them to the receiver, where they are decoded. In a real world application the data from the transmitter would be sent to an RF (radio frequency) transmitter circuit and the data feeding the receiver would come from an RF receiver circuit.

Figure 19:
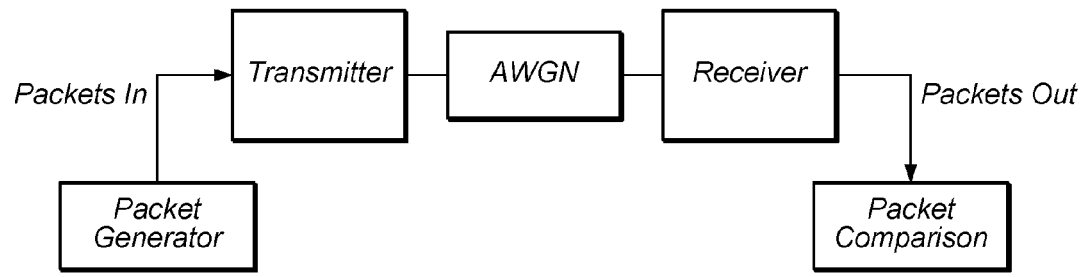

To test the system, test harness components may be added to the system, each running on the HyperX™ hardware, as illustrated by FIG. 19. In this exemplary embodiment, a test data generator, labeled "packet generator", has been added, which generates test packets with known content and sends these input packets to the transmitter. As also shown, an AWGN (additive white Gaussian noise) component for channel impairments is interposed between the transmitter and the receiver. This component emulates transmission over airwaves by adding noise to the signal, and sends the resulting noisy signal to the receiver. Finally, a packet comparator, so labeled, is coupled to the receiver. The receiver decodes the noisy signal, and sends the decoded signals to the packet comparator to count packet and bit error rates.

AWGN and Constellation

In some embodiments, an AWGN view may control the HyperX additive white Gaussian noise (AWGN) generator component. The AWGN component may be supplied with example code and used to add an adjustable amount of noise to the transmitter output.

In one embodiment, a constellation view may show the effectiveness of decoding a Quadrature Amplitude Modulation (QAM) signal. IQ data may be shown as a constellation plot (also known as a scatter plot), or as a 2D or 3D heat map, among other forms of display.

Figure 20:
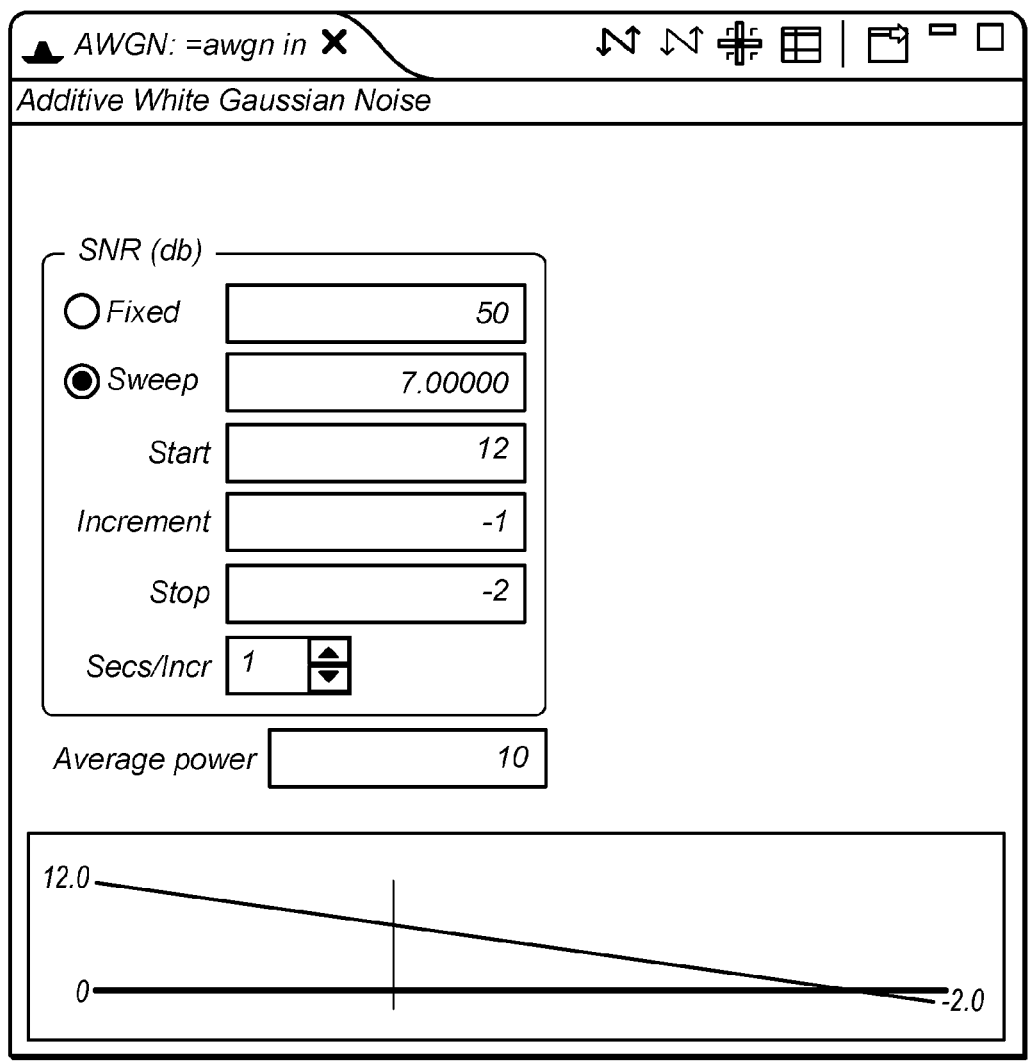
FIG. 20 illustrates an exemplary AWGN (added white Gaussian noise) user interface view for specifying and/or indicating applied AWGN.

FIG. 20 illustrates an exemplary AWGN user interface view for specifying and/or indicating the applied AWGN, according to one embodiment. The AWGN user interface view may send an AWGN control message (packet) to the AWGN generator component. The packet may contain the requested SNR and assumed average signal power. The AWGN component may treat the transmitter output as having the given average power. It may use the requested SNR and compute the amplitude of the noise to be added to the transmitter output.

The AWGN user interface view may periodically send a packet to the HyperX™ hardware to adjust AWGN noise settings. In one embodiment, AWGN may operate in two modes: Fixed and Sweep.

In Fixed mode, one AWGN control packet may be sent, containing the SNR value from the Fixed field, and the value of the Average power field.

In Sweep mode, an AWGN control packet may be sent periodically. The Secs/Incr spinner control shown may adjust the number of seconds between updates. The SNR may sweep from the start value to the stop value, and may be incremented each time by the increment value. The first packet may use the SNR value in the sweep field. Once a packet is sent with the stop value, the sweep may begin again at the start value.

Note that in the embodiment shown, the small graph at the bottom provides an indication of progress in the sweep.

TABLE 4

| Type | Name | Description |
| --- | --- | --- |
| byte[4] | sentinal | 0xa3, 0x78, 0x56, 0x1f |
| int16_t | commID | CommID |
| int16_t | length | Application data word count |
| float32 | SNR | Signal to noise ratio after noise is added in |
| float32 | average power | Average power attributed of the transmitter output signal |

Note further that the AWGN component may respond not only to the arrival of new data blocks but also the arrival of control packets. This may be accomplished by polling the arrival ports in a round robin fashion. Polling however has the PE run continuously, dissipating electrical energy. There are various prior art ways to pause a PE to save electrical energy, because when paused, PE power dissipation is much less than while running, often by orders of magnitude. PE pauses (also referred to as a wait states or just "waiting") may be coordinated with particular events that are internal or external to the PE. PE pauses may be initiated by software at the PE execution of a binary instruction to wait. Exit from the wait instruction may be dependent on one or more wake-up signals. A DMR may send one or more wake-up signals to one or more of its neighboring PEs, and a PE may receive wake up signals from all of its neighboring DMRs. Wake-up signals may be communicated from a DMR to PEs by physical circuits that are part of the DMR-PE interfaces but are independent of PIN or SIN. A DMR has registers referred to as mask registers that may be configured to select which link ports will be enabled to source a wake-up signal upon the arrival of data triggering event. Additional registers may be configured to determine whether a wake up signal for a particular PE is generated when any one the enabled ports is triggered or not generated until all of the enabled ports are triggered. Examples of the operation of these hardware functions are detailed in HyperX™ user manuals for the hx3100A integrated circuit product.

Exemplary source code for the AWGN component is shown below followed by a description of its operation. This provides an RTA context for wait and wake-up signaling. Note that this AWGN code is only an example and may have many variations to adjust performance, instruction memory size, buffer sizes, signal sample value types, etc.

```
mpx_view awgnView( ) {
    MPX_Setup Wake( controlIn );   //enables wake-signal for commID=controlIn
    MPX_Setup Wake( dataIn ); //enables wake-signal for commID=dataIn
    MPX_Recv( &control, sizeof(control), MPX_INT, controlIn,
MPX_NONBLOCKING );   //start receive of control packet, don't wait here for completion
    MPX_Recv( &data, 2, MPX_INT, dataIn, MPX_NONBLOCKING );
    //start receive of data block (signal of interest), don't wait here for completion
    while (1) {        // loop indefinitely
        MPX_Wait( );   // wait for a wake up signal for any arrival on any enabled port
        if ( MPX_Rtest(controlIn) == DMA_DONE ) {   // test for completed receive of control packet
            snr = control.snr;   // extract the current S/N ratio value from the packet
            average_noise = computeAverageNoiseFromSignalPower( control.averageSignalPower );
            MPX_Recv( &control, sizeof(control), MPX_INT, controlIn,
MPX_NONBLOCKING); // start receive of another control packet, don't wait here for completion
        }
        if (MPX_Rtest(dataIn) == DMA_DONE) { // test for completed receive of data block
            addNoise( data, 2);   //call the function for noise addition to the data block
            MPX_Send( data, 2, MPX_INT, dataOut, MPX_DMA ); // send data block to the Receiver
            MPX_Recv( data, 2, MPX_INT, dataIn,
MPX_NONBLOCKING ); // start receive of another data block
        }
    }
}
```

In this exemplary embodiment, the function awgnView( ) begins by enabling wake-signal sources from the DMR ports associated with commIDs "controlIn" and "dataIn". Then it starts to receive a control packet into a buffer in memory named "control" wherein the arguments to the MPX_Recv function specify the buffer address, a packet size, a data type for the packet elements (here MPX_INT specifies integers), a commID, and non-blocking mode). Non-blocking mode means that program control does not wait until the buffer is full but immediately proceeds to the next statement. The next statement starts to receive a data block into a buffer named "data" which contains only 2 elements of type integer, from commID dataIn, and its mode is non-blocking.

The next statement is a while loop that runs indefinitely across a program block that embraces two parts, each gated by a test. The test for the first part (MPX_Rtest(controlIn) ==DMA_DONE) is made to see if the wakeup signal has been received for controlIn. MPX_Rtest (controlIn) returns the DMA_DONE value if there has been a wakeup signal from commID controlIN. Once the wakeup has been received, the program processes the computation of average noise; and then starts to read another control packet; otherwise program control moves down to the test (MPX_Rtest (dataIn)==DMA_DONE) for the second part. This test becomes true when the wakeup for dataIn is received, and if so then program control proceeds to call the function addNoise(data, 2) to add noise to the values in the data buffer. This is followed by an MPX_Send of the noised data out of the DMR by way of commID dataOut which is a pathway to the Receiver application executing on the DUT. This send is blocking to be sure it completes before proceeding to the last statement, which is a non-blocking receive to start receiving another data block from commID dataIn. Program control then loops back up to the while statement and then the Wait statement where the PE waits until the arrival of either a new control packet or a new data block.

Constellation

Figure 21:
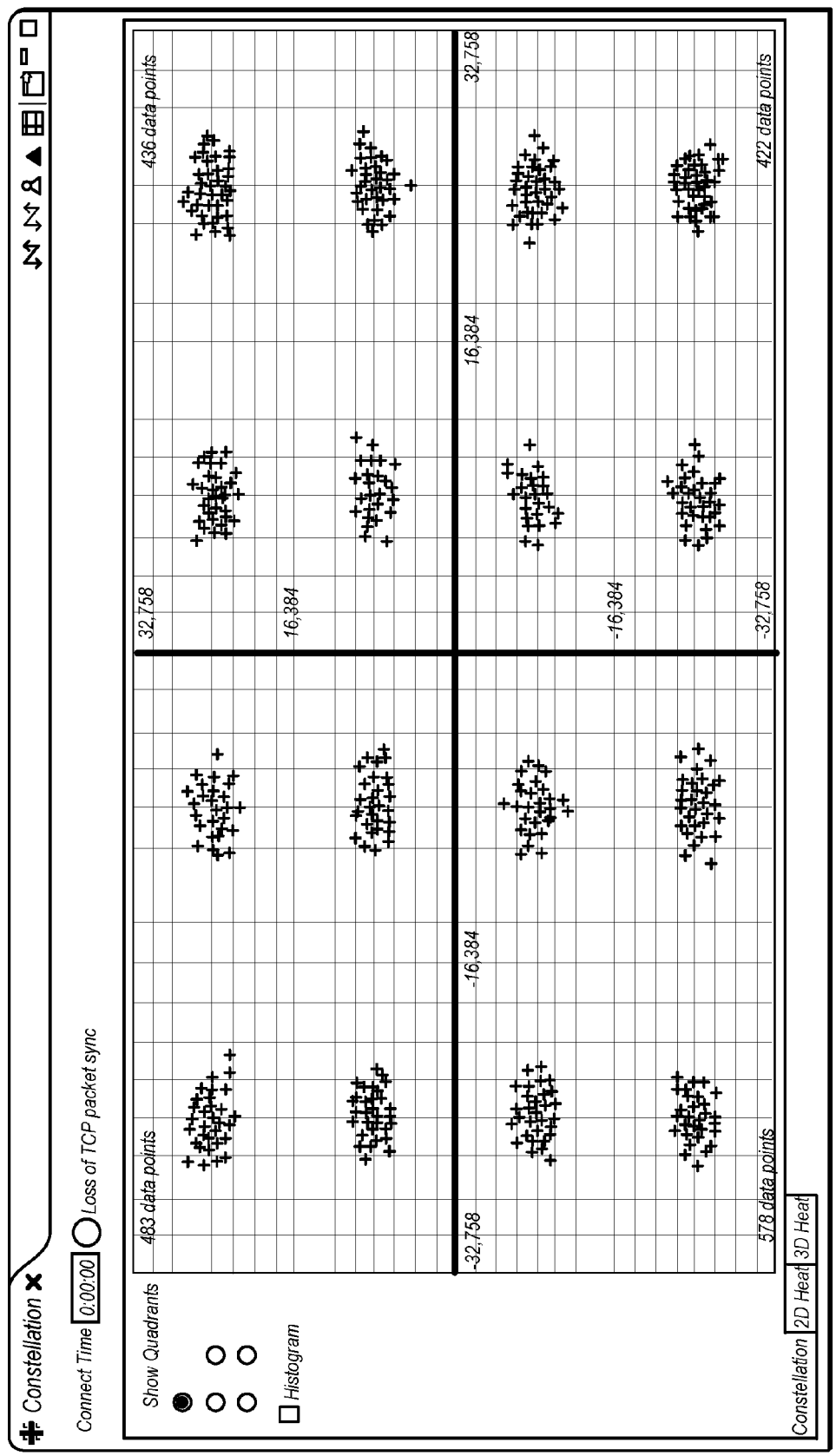
FIG. 21 illustrates an exemplary constellation view, according to one embodiment.

FIG. 21 illustrates an exemplary constellation view, according to one embodiment. The constellation view may graphically show the effectiveness of decoding a Quadrature Amplitude Modulation (QAM) signal. IQ data can be shown as a constellation plot (also known as a scatter plot), or as a 2D or 3D heat map. Selection among the graph types may be performed via a set of tabs at the bottom of the view, as shown.

Video Example

Figure 22:
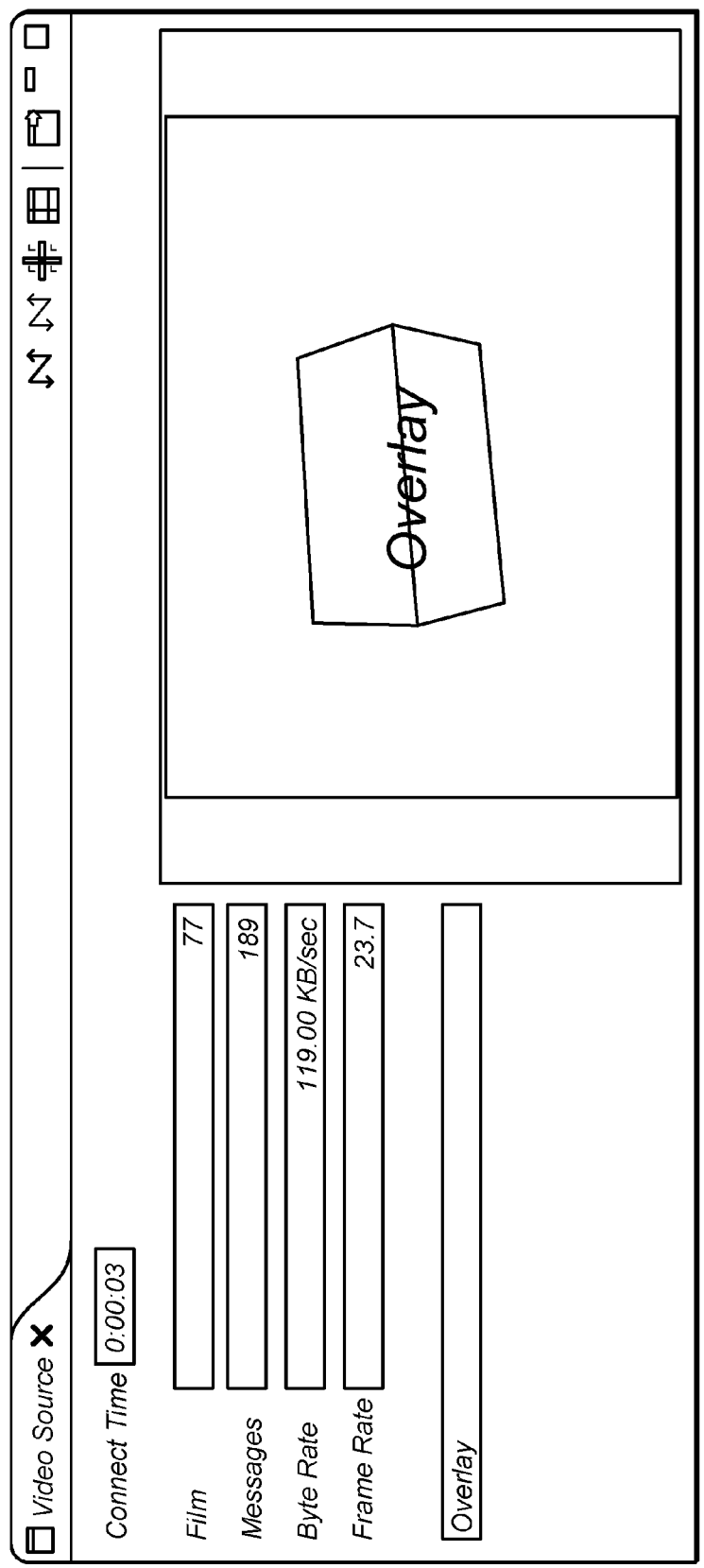
FIG. 22 illustrates a video source view (GUI) whereby various parameters or attributes may be configured and/or displayed, according to one embodiment.

The following describes a simple example in which a video source sends image frames to a chip. FIG. 22 illustrates a video source view (GUI) whereby various parameters or attributes may be configured and/or displayed, e.g., number of files ("Files"), number of messages ("Messages"), data rate ("Byte Rate"), and frame rate ("Frame Rate"). As FIG. 22 also shows, a field is also provided for specifying an image overlay, specifically, image overlay text, which in this example, is "Overlay".

In this exemplary embodiment, each frame is formatted as a JPEG image. The JPEG data are:
1. read from a file;
2. decoded into an image;
3. image overlay text is written to the file;
4. the image is re-encoded into a JPEG; and
5. the image is sent to the chip.

In this embodiment, the image is sent using fixed size messages of 1024 words. Therefore the final JPEG image may be divided into multiple messages.

In further embodiments, particularly for more complex, dense MPAs, relatively complex instruments may be programmed and inserted per the above techniques. Such software based instruments are generally termed "synthetic instruments (SI)", and may implement such instrument functionality as a spectrum analyzer or a vector signal analyzer, among others.

Exemplary Benefits

The following is a list of possible benefits of the techniques disclosed herein, although it should be noted that the benefits listed are exemplary only, and are not intended to limit the actual benefits of the techniques disclosed to any particular set of benefits.

Automatic setup of probes, and off chip communication pathways once a user has selected test points;

Automatic probing of memory locations and signals;

Smart variation of runtime to adapt to changed signal to noise ratio;

Increased bandwidth of signal measurements;

Increased rate of making measurements;

Better compression of measurement data before it gets off chip;

Higher rate of test completions;

More thorough testing and characterization of application software;

Possible reduction in the numbers and types of test equipment needed; and

Observation does not perturb original design operation, functionality or performance.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A method, comprising:
analyzing application software;
developing test software based, at least in part, on results of analyzing the application software;
deploying the application software on a first hardware resource of a multi-processor array (MPA), wherein the MPA includes a plurality of processing elements, a plurality of memories, and an interconnection network communicatively coupling the plurality of processing elements to the plurality of memories, wherein the first hardware resource includes at least a first subset of the plurality of processing elements;
deploying the test software on a second hardware resource of the MPA, wherein the second hardware resource includes at least a second subset of the plurality of processing elements different than the first subset of the plurality of processing elements;
executing the application software on the first hardware resource; and
executing the test software on the second hardware resource, wherein executing the test software includes:
polling, by a first processing element included in the second hardware resource, one or more registers associated with a direct memory access (DMA) transfer in the first hardware resource resulting from executing one or more program commands included in the application software; and
sending, by the first processing element, auxiliary data retrieved from the one or more registers to a storage location for analysis, wherein an amount of auxiliary data is less than an amount of data generated by the application software; and
rebuilding the application software based on the auxiliary data.

2. The method of claim 1, wherein a priority of the first processing element polling is less than a priority associated with performing the DMA in the first hardware resource.

3. The method of claim 1, further comprising modifying the application software to include at least one probe command, and wherein executing the application software on the first hardware resource includes generating probe data in response to executing the at least one probe command.

4. The method of claim 3, wherein executing the application software on the first hardware resource includes:
streaming, by a first DMA engine of a plurality of DMA engines, data resulting from executing the application software and the probe data to a particular memory of the plurality of memories; and streaming, by a second DMA engine of the plurality of DMA engines, the data resulting from executing the application software to a target location in the plurality of memories.

5. The method of claim 4, wherein executing the test software on the second hardware resource includes streaming, by a third DMA engine of the plurality of DMA engines, to the storage location for analysis.

6. The method of claim 5, further comprising coordinating operation of the first, second, and third DMA engines.

7. A non-transitory computer-accessible storage medium having program instructions stored therein that, in response to execution by a multi-processor system, causes the multi-processor system to perform operation including:
analyzing application software;
developing test software based, at least in part, on results of analyzing the application software;
deploying the application software on a first hardware resource of a multi-processor array (MPA), wherein the MPA includes a plurality of processing elements, a plurality of memories, and an interconnection network communicatively coupling the plurality of processing elements to the plurality of memories, wherein the first hardware resource includes at least a first subset of the plurality of processing elements;
deploying the test software on a second hardware resource of the MPA, wherein the second hardware resource includes at least a second subset of the plurality of processing elements different than the first subset of the plurality of processing elements;
executing the application software on the first hardware resource; and
executing the test software on the second hardware resource, wherein executing the test software includes:
polling, by a first processing element included in the second hardware resource, one or more registers associated with a direct memory access (DMA) transfer in the first hardware resource resulting from executing one or more program commands included in the application software; and
sending, by the first processing element, auxiliary data retrieved from the one or more registers to a storage location for analysis, wherein an amount of auxiliary data is less than an amount of data generated by the application software; and
rebuilding the application software based on the auxiliary data.

8. The non-transitory computer-accessible storage medium of claim 7, wherein a priority of the first processing element polling is less than a priority associated with performing the DMA in the first hardware resource.

9. The non-transitory computer-accessible storage medium of claim 7, wherein the operations further include modifying the application software to include at least one probe command, and wherein executing the application software on the first hardware resource includes generating probe data in response to executing the at least one probe command.

10. The non-transitory computer-accessible storage medium of claim 9, wherein executing the application software on the first hardware resource includes:
streaming, by a first DMA engine of a plurality of DMA engines, data resulting from executing the application software and the probe data to a particular memory of the plurality of memories; and
streaming, by a second DMA engine of the plurality of DMA engines, the data resulting from executing the application software to a target location in the plurality of memories.

11. The non-transitory computer-accessible storage medium of claim 10, wherein executing the test software on the second hardware resource includes streaming, by a third DMA engine of the plurality of DMA engines, to the storage location for analysis.

12. The non-transitory computer-accessible storage medium of claim 11, wherein the operations further include coordinating operation of the first, second, and third DMA engines.

13. The non-transitory computer-accessible storage medium of claim 11, wherein the operations further include:
streaming, by the first DMA engine, the data resulting from executing the application software via a first one or more routes included in a set of routes defined for the application software;
streaming, by the second DMA engine, the data resulting from executing the application software via a second one or more routes included in the set of routes defined for the application software; and
streaming, by the third DMA engine, the probe data via a third one or more routes excluded from the set of routes defined for the application software.

14. A system, comprising:
one or more memories configured to store instructions;
one or more processors configured to receive instructions from the one or more memories and execute the instructions to cause the system to perform operations including:
analyzing application software;
developing test software based, at least in part, on results of analyzing the application software;
deploying the application software on a first hardware resource of a multi-processor array (MPA), wherein the MPA includes a plurality of processing elements, a plurality of memories, and an interconnection network communicatively coupling the plurality of processing elements to the plurality of memories, wherein the first hardware resource includes at least a first subset of the plurality of processing elements;
deploying the test software on a second hardware resource of the MPA, wherein the second hardware resource includes at least a second subset of the plurality of processing elements different than the first subset of the plurality of processing elements;
executing the application software on the first hardware resource; and
executing the test software on the second hardware resource, wherein executing the test software includes:
polling, by a first processing element include in the second hardware resource, one or more registers associated with a direct memory access (DMA) transfer in the first hardware resource resulting from executing one or more program commands included in the application software; and
sending, by the first processing element, auxiliary data retrieved from the one or more registers to a storage location for analysis, wherein an amount of auxiliary data is less than an amount of data generated by the application software; and
rebuilding the application software based on the auxiliary data.

15. The system of claim 14, wherein a priority of the first processing element polling is less than a priority associated with performing the DMA in the first hardware resource.

16. The system of claim 14, wherein the operations further include modifying the application software to include at least one probe command, and wherein executing the application software on the first hardware resource includes generating probe data in response to executing the at least one probe command.

17. The system of claim 14, wherein executing the application software on the first hardware resource includes:
   streaming, by a first DMA engine of a plurality of DMA engines, data resulting from executing the application software and the probe data to a particular memory of the plurality of memories; and
   streaming, by a second DMA engine of the plurality of DMA engines, the data resulting from executing the application software to a target location in the plurality of memories.

18. The system of claim 17, wherein executing the test software on the second hardware resource includes streaming, by a third DMA engine of the plurality of DMA engines, to the storage location for analysis.

19. The system of claim 18, wherein the operations further include coordinating operation of the first, second, and third DMA engines.

20. The system of claim 18, wherein the operations further include:
   streaming, by the first DMA engine, the data resulting from executing the application software via a first one or more routes included in a set of routes defined for the application software;
   streaming, by the second DMA engine, the data resulting from executing the application software via a second one or more routes included in the set of routes defined for the application software; and
   streaming, by the third DMA engine, the probe data via a third one or more routes excluded from the set of routes defined for the application software.

* * * * *